(12) United States Patent
Niwa et al.

(10) Patent No.: US 8,518,632 B2
(45) Date of Patent: *Aug. 27, 2013

(54) METHOD OF MANUFACTURING ELECTROFORMING MOLD, ELECTROFORMING MOLD, AND METHOD OF MANUFACTURING ELECTROFORMED COMPONENT

(75) Inventors: Takashi Niwa, Kashiwa (JP); Matsuo Kishi, Chiba (JP); Koichiro Jujo, Kisarazu (JP); Hiroyuki Hoshina, Funabashi (JP)

(73) Assignee: Seiko Instruments Inc., Chiba-Shi (JP)

( * ) Notice: Subject to any disclaimer, the term of this patent is extended or adjusted under 35 U.S.C. 154(b) by 775 days.

This patent is subject to a terminal disclaimer.

(21) Appl. No.: 12/376,629

(22) PCT Filed: Jul. 10, 2007

(86) PCT No.: PCT/JP2007/063743
§ 371 (c)(1),
(2), (4) Date: May 5, 2010

(87) PCT Pub. No.: WO2008/018261
PCT Pub. Date: Feb. 14, 2008

(65) Prior Publication Data
US 2010/0288643 A1 Nov. 18, 2010

(30) Foreign Application Priority Data
Aug. 7, 2006 (JP) ................. 2006-214977

(51) Int. Cl.
*G03F 7/00* (2006.01)
(52) U.S. Cl.
USPC ........... 430/312; 430/320; 438/689; 425/385; 264/219; 204/281

(58) Field of Classification Search
USPC ........ 264/219; 425/385; 430/312; 438/689; 204/281; 246/8–11, 41, 47, 49
See application file for complete search history.

(56) References Cited

U.S. PATENT DOCUMENTS
5,488,253 A 1/1996 Matsuoka
(Continued)

FOREIGN PATENT DOCUMENTS
EP 1 462 859 9/2004
(Continued)

OTHER PUBLICATIONS

Ehrfeld et al., "Materials for Liga Products", IMM Institut fuer Mikrotechnik GmbH, Mainz, Germany, 1994, pp. 86-90.
(Continued)

*Primary Examiner* — Joseph S. Del Sole
*Assistant Examiner* — Nahida Sultana
(74) *Attorney, Agent, or Firm* — Grossman, Tucker, Perreault & Pfleger, PLLC

(57) ABSTRACT

In a method of manufacturing an electroforming mold, a first photoresist layer is formed on an upper surface of a bottom conductive film of a substrate, and the first photoresist layer is divided into a first soluble portion and a first insoluble portion. A conductive material is thermally deposited on an upper surface of the first photoresist layer within a predetermined temperature range, to thereby form an intermediate conductive film. An intermediate conductive film is patterned. A second photoresist layer is formed on an exposed upper surface of the first photoresist layer after the intermediate conductive film is removed, and on an upper surface of the intermediate conductive film remaining after patterning. The second photoresist layer is divided into a second soluble portion and a second insoluble portion. Next, the first and second photoresist layers are developed, and the first and second soluble portions are removed.

21 Claims, 24 Drawing Sheets

(56) References Cited

U.S. PATENT DOCUMENTS

| | | | |
|---|---|---|---|
| 5,783,371 | A | 7/1998 | Bifano |
| 5,944,974 | A | 8/1999 | Fahrenberg et al. |
| 6,036,832 | A | 3/2000 | Knol et al. |
| 6,156,487 | A * | 12/2000 | Jennison et al. ............... 430/316 |
| 6,586,112 | B1 | 7/2003 | Te |
| 7,887,995 | B2 * | 2/2011 | Niwa et al. .................... 430/312 |
| 8,366,431 | B2 * | 2/2013 | Malloy ........................ 425/345 |
| 2002/0006584 | A1 | 1/2002 | Yagi et al. |
| 2002/0052100 | A1 * | 5/2002 | Tanaka et al. ................. 438/585 |
| 2004/0191704 | A1 | 9/2004 | Nishi et al. |
| 2005/0140838 | A1 * | 6/2005 | Oh et al. ........................ 349/42 |
| 2006/0160027 | A1 | 7/2006 | Niwa |
| 2007/0082299 | A1 * | 4/2007 | Marks .......................... 430/321 |
| 2008/0197506 | A1 * | 8/2008 | Nagai .......................... 257/773 |
| 2008/0248264 | A1 * | 10/2008 | Jeon et al. ................... 428/195.1 |
| 2010/0090239 | A1 * | 4/2010 | Lin et al. ....................... 257/98 |
| 2011/0155201 | A1 * | 6/2011 | Abagnale et al. ............. 136/212 |
| 2011/0163457 | A1 * | 7/2011 | Mohan et al. ................ 257/774 |
| 2011/0169027 | A1 * | 7/2011 | Park et al. ....................... 257/98 |
| 2011/0203934 | A1 * | 8/2011 | Rey-Mermet .................. 205/67 |
| 2012/0328728 | A1 * | 12/2012 | Nakatsuka et al. ........... 425/385 |
| 2013/0071790 | A1 * | 3/2013 | Huang et al. ................. 430/296 |

FOREIGN PATENT DOCUMENTS

| | | |
|---|---|---|
| EP | 1681375 | 7/2006 |
| JP | 52-60241 | 5/1977 |
| JP | 2-43380 | 2/1990 |
| JP | 4200007 | 7/1992 |
| JP | 10-245692 | 9/1998 |
| JP | 11-15126 | 1/1999 |
| JP | 11293486 | 10/1999 |
| JP | 2007046147 | 2/2007 |
| WO | 2004/101857 | 11/2004 |

OTHER PUBLICATIONS

International Search Report dated Oct. 23, 2007 issued in related International Patent Application No. PCT/JP2007/063743.
Office Action from related U.S. Appl. No. 11/326,149 dated Oct. 29, 2009.
Office Action from related U.S. Appl. No. 12/657,150 dated Jun. 8, 2011.
Search Report from related EPO Appl. No. 06250021.0 dated Mar. 26, 2008.
Hewlett-Packard Company et al. "A method of electroforming a nozzle plate with thin break tabs", Research Disclosure, Mason Publications, Hampshire, Great Britain, vol. 1, 482, No. 32, Jun. 2004.

* cited by examiner

METHOD OF MANUFACTURING ELECTROFORMING MOLD, ELECTROFORMING MOLD, AND METHOD OF MANUFACTURING ELECTROFORMED COMPONENT

CROSS REFERENCE TO RELATED APPLICATIONS

This application is a national stage of International Patent Application No. PCT/JP2007/063743 filed Jul. 10, 2007, and claims the benefit of priority under 35 U.S.C. §119 of Japanese Patent Application No. 2006-214977, filed Aug. 7, 2006, the entire contents of all of which are incorporated herein by reference.

TECHNICAL FIELD

The present invention relates to a method of manufacturing a mold of a fine component, and in particular, to a method of manufacturing an electroforming mold having a multistage structure, an electroforming mold, and a method of manufacturing an electroformed component using the electroforming mold.

BACKGROUND ART

An electroforming method is suitable for mass production and is used in manufacturing various components. For example, a conductive film is deposited on the surface of resin onto which the shape of a prototype is impress-patterned, thereby manufacturing a clock hand (for example, see Patent Document 1).

As a method of impress-patterning a prototype into resin, a hot press molding method is known (for example, see Patent Document 1). In the hot press molding method, resin is heated to a glass transition temperature or higher and softened, and the prototype is pressed to impress-pattern the shape of the prototype into the resin. According to the hot press molding method, the shape of the prototype can be impress-patterned into the resin with nanometer dimensions and nanoscale accuracy.

In recent years, as a mold for manufacturing a component or die having a fine shape, a mold using a silicon process is used. As a method of manufacturing a mold used for an electroforming method using a silicon process, a LIGA (Lithographic Galvanoformung Abformung) method is widely known. In the LIGA method, a resist material, such as PMMA (polymethylmethacrylate), is used to coat on an electrode, and synchrotron radiation is irradiated onto the resist material within a region of a desired shape to expose the resist material. After the resist material is developed, electroforming is executed, thereby manufacturing a fine structure having a desired fine shape (for example, Non-Patent Document 1). An example is known in which the LIGA method is repeatedly executed multiple times to form a multistage structure, such as a gearshift (for example, see Patent Document 2). In addition, a UV-LIGA method is used in which a resist pattern is formed by ultraviolet light, which is used in a general semiconductor exposure apparatus, instead of expensive synchrotron radiation, which is used for the LIGA method. In the case of the mold for the electroforming method manufactured by the LIGA method or the UV-LIGA method, no electrode is provided on the side wall of the mold, and an electroformed object is deposited from the bottom surface of the mold. For this reason, even if a structure with a high aspect ratio is manufactured by the electroforming method, a good component with no air bubbles or defects inside the electroformed object can be formed. Like the technology described in Patent Document 2, by repeatedly executing the UV-LIGA method multiple times, a multistage shape can be manufactured.

According to the technology described in Patent Document 3, resist coating and exposure are repeatedly executed multiple times, and then development is executed. In this way, a resist mold having a multistage structure is formed. In this case, a multistage portion is used as a pattern for a monitor with different thickness of the electroformed object.

[Patent Document 1] JP-A-52-60241
[Patent Document 2] JP-A-11-15126
[Patent Document 3] JP-A-10-245692
[Non-Patent Document 1] W. Ehrfeld: IEEE, Micro Electro Mechanical System Proceedings PP86, 1994

DISCLOSURE OF INVENTION

Problems to be Solved by the Invention

According to the technology described in Patent Document 1, an electroforming mold is manufactured by forming electrodes on all of the surfaces (hereinafter, referred to as electroforming surface) of the resin (hereinafter, referred to as impress-patterned resin mold) with the shape impress-patterned, on which electroforming is executed. Accordingly, if electroforming is executed, the electroformed object is deposited from all the surfaces on which the electrodes of the electroforming mold are formed. For this reason, in order to take out a clock hand, it is necessary to remove an unnecessary portion. In addition, when an electroformed component with a high aspect ratio is manufactured, if electroforming is executed simultaneously from the side surfaces and the bottom surface of the mold, an electric field is likely to be concentrated at a side opposite the bottom surface of the mold from among the side surfaces of the mold, that is, at the top surface of the mold, and an electroforming rate becomes high on the top surface of the mold from among the side surfaces of the mold. For this reason, the electroformed object deposited from the side surfaces of the mold may be connected at the top surface of the mold, and a gap may occur inside the electroformed object. As a result, the strength or mold transfer property of an electroformed component may be deteriorated.

According to the technology described in Patent Document 2 and Non-Patent Document 1, an electrode can be formed only on the bottom surface of the electroforming mold. For this reason, an electroformed component with no gap in the electroformed object can be manufactured. However, according to the technology described in Non-Patent Document 1, only a single-stage structure can be manufactured. In addition, according to the technology described in Patent Document 2, although a multistage structure is manufactured, after a mold of a first stage is formed and electroforming is executed, resist is separated, and resist is coated again to form a mold structure of a second stage. However, it is very difficult to control the thickness during electroforming of the first stage due to electric field concentration or the like. Similarly, it is very difficult to control surface roughness of the electroformed object of the first stage due to electric field concentration. According to the technology described in Patent Document 2, in coating resist of the second stage, the resist is coated on a wafer on which an electroformed object having a large step is present. For this reason, it is difficult to control the thickness of the resist of the second stage. In addition, according to the technology described in Patent Document 2, a structure in which the electroformed object of the second stage has a width smaller than the electroformed object of the first stage is manufactured. Meanwhile, when a structure in which the electroformed object of the second stage has a width larger than the electroformed object of the first stage is manufactured, it is difficult to execute electroforming of the second stage due to the same reason described with reference to FIG. 28.

FIG. 28 is a diagram illustrating a state where a multistage resist mold 204 is formed on an electrode 202, and electroforming is executed by using the resist mold 204. After electroforming is executed to the thickness of a first-stage resist mold 204a on the electrode 202, electroforming is further executed. In this case, since no electrode is present on the upper surface C of the first-stage resist mold 204a. For this reason, an electroformed object 2100 is hard to grow in a direction of an arrow B, that is, in a direction parallel to the surface of the electrode. Accordingly, even if the electroformed object 2100 grows to the height of a second-stage resist mold 204b, a cavity 2103 of the resist mold cannot be filled with the electroformed object 2100. In order that the cavity 2103 is completely filled with the electroformed object 2100, it is necessary to increase the thickness of the electroformed object 2100. Accordingly, electroforming takes more time, and simultaneously it takes a more time to grind the electroformed object 2100 to have a desired thickness. In order to solve these problems, a method may be considered in which a metal is deposited on a multistage resist mold 204 and patterned. In this case, however, the number of steps increases, and simultaneously pattern accuracy varies due to the difference in height of the resin, which makes it difficult to obtain a desired electrode pattern.

According to the technology described in Patent Document 3, after resist coating and exposure are repeatedly executed multiple times, development is executed, thereby forming a resist mold having a multistage structure. In this case, however, no electrode is present on each layer. As a result, due to the same reason as described with reference to FIG. 28, it is difficult to manufacture an electroformed component having a multistage structure.

The invention has been made in order to solve the drawbacks inherent in the known method of manufacturing an electroforming mold, and it is an object of the invention to provide a method of manufacturing an electroforming mold having a multistage structure, which facilitates height control, an electroforming mold, and a method of manufacturing an electroformed component.

Means for Solving the Problem

A method of manufacturing an electroforming mold according to the present invention includes: a first photoresist layer formation step of forming a first photoresist layer on an upper surface of a conductive substrate; a first photoresist layer exposure step of exposing the first photoresist layer to light through a first mask pattern disposed above the first photoresist layer to divide the first photoresist layer into a first soluble portion and a first insoluble portion; an intermediate conductive film formation step of thermally depositing a conductive material by using a vacuum deposition method within a temperature range in which light with a wavelength within a range not causing photoreaction in the first photoresist layer is emitted, to thereby form an intermediate conductive film on an upper surface of the first photoresist layer; a patterning resist formation step of forming a patterning resist on an upper surface of the intermediate conductive film; a patterning step of patterning the intermediate conductive film through the patterning resist; a patterning resist removal step of removing the patterning resist remaining after the patterning step; a second photoresist layer formation step of forming a second photoresist layer on an upper surface of the first photoresist layer exposed by the patterning step and on an upper surface of the intermediate conductive film exposed by the patterning resist removal step; a second photoresist layer exposure step of exposing the second photoresist layer to light through a second mask pattern disposed above the second photoresist layer to divide the second photoresist layer into a second soluble portion and a second insoluble portion; and a soluble portion removal step of removing the first soluble portion of the first photoresist layer and the second soluble portion of the second photoresist layer by developing the first photoresist layer and the second photoresist layer.

According to the method of manufacturing an electroforming mold of the present invention, the first photoresist layer is formed on the conductive substrate, and the intermediate conductive film is formed on the first photoresist layer so as not to expose the first photoresist layer. Next, the intermediate conductive film is patterned. Thereafter, the second photoresist layer is formed on the upper surface of each of the intermediate conductive film and the first photoresist layer. Next, the first photoresist layer and the second photoresist layer are developed, and the first soluble portion of the first photoresist layer and the second soluble portion of the second photoresist layer are removed. In this way, an electroforming mold having a multistage structure, in which an intermediate conductive film (electrode) is formed at the bottom of each step portion, as well as the bottom of the mold, can be manufactured.

In forming the intermediate conductive film, an etching method using patterning is used. Therefore, the intermediate conductive film can be formed with simple process while no burrs are generated in an end portion, as compared with a case in which an intermediate conductive film is formed by using, for example, a lift-off method.

In the method of manufacturing an electroforming mold according to the present invention, in the intermediate conductive film formation step, an electrical resistance heating method may be preferably used as a heating means.

The reason for this is that the electrical resistance heating method can be easily executed with high reliability since a general electrical resistance heating method is used as heating means of the vacuum deposition method.

In the method of manufacturing an electroforming mold according to the present invention, in the intermediate conductive film formation step, light with a wavelength within a range not causing photoreaction in the first photoresist layer may be preferably light with wavelength ranging from 0.4 µm to 30 µm.

In general, the first photoresist layer is formed of a resist material that is affected only by ultraviolet light or light with a wavelength shorter than ultraviolet light, and such a resist material is not affected by light with wavelength ranging from 0.4 µm to 30 µm. That is, the above range is preferable because the first photoresist layer, which has already been divided into the first soluble portion and the first insoluble portion, is not influenced by the intermediate conductive film formation step which is to be subsequently performed.

In the method of manufacturing an electroforming mold according to the present invention, in the intermediate conductive film formation step, the temperature range of heating of the conductive material, in which light with a wavelength within a range not causing photoreaction in the first photoresist layer is emitted, may be preferably from 170° C. to 2000° C.

The reason for this is that because the temperature range of heating of the conductive material is set to be equal to or less than 2000° C., ultraviolet light is not generated when the conductive material is evaporated even though a general conductive material which is used to form the intermediate conductive film is used. In addition, even though molybdenum which evaporates at a comparatively low temperature is used as a crucible at the time of deposition, the crucible formed of molybdenum does not evaporates. In addition, because the temperature range of heating of the conductive material is equal to or more than 170° C., even though zinc is used as the conductive material, zinc can be evaporated.

In the method of manufacturing an electroforming mold according to the present invention, the conductive substrate may be preferably configured such that a bottom conductive film is formed on an upper surface of a substrate.

The reason for this is that because the conductive substrate has the substrate and the bottom conductive film, a nonconductive substrate, such as an epoxy-type substrate, which is generally used, can be used.

In the method of manufacturing an electroforming mold according to the present invention, the first photoresist layer and the second photoresist layer may be preferably formed of a negative type photoresist.

The reason for this is that a process for manufacturing a multistage electroforming mold can be simplified.

In the method of manufacturing an electroforming mold according to the present invention, in the patterning resist formation step, the patterning resist may be preferably formed so as to cover only the first insoluble portion of the first photoresist layer divided by exposure through the first mask pattern.

The reason for this is that, if the patterning resist is formed so as to cover only the first insoluble portion of the first photoresist layer, the intermediate conductive film on the first insoluble portion of the first photoresist layer is disposed. In other words, the patterning resist is disposed on the first soluble portion of the first photoresist layer, and the intermediate conductive film is formed on the patterning resist. Therefore, when the first soluble portion of the first photoresist layer is developed and removed in a subsequent step, the intermediate conductive film is removed together with the first soluble portion, which is not meaningful.

In the method of manufacturing an electroforming mold according to the present invention, in the patterning resist formation step, the patterning resist may be preferably formed so as to be recessed from the boundary between the first insoluble portion and the first soluble portion of the first photoresist layer toward the first insoluble portion by a distance equal to or more than 1 µm and equal to or less than 500 µm.

The reason for this is that because an electrode which is formed of the intermediate conductive film is formed so as to be recessed by the distance equal to or more than 1 µm and equal to or less than 500 µm from a marginal portion (edge portion) of a step portion of the first photoresist layer, a thick portion can be prevented from being formed at a front end of the electrode at the time of electroforming. If an electrode is present in the edge portion at the time of electroforming, an electric field may be likely to be concentrated at the edge portion, and as a result, there may be a problem that a portion at the front end of the electrode may become thicker than other portions of the electrode.

In the method of manufacturing an electroforming mold according to the present invention, in the second photoresist layer exposure step, a part of an upper portion of a surface of the second photoresist layer in contact with the intermediate conductive film may be preferably exposed to light.

The reason for this is that an electroforming mold having a multistage structure, in which an intermediate conductive film (electrode) is formed in an intermediate step portion, can be reliably obtained.

In the method of manufacturing an electroforming mold according to the present invention, in the patterning resist formation step, dry film resist may be preferably used as the patterning resist.

The reason for this is that because the dry film resist includes no organic solvent, there is little possibility that the first insoluble portion and the first soluble portion of the first photoresist layer may be dissolved, as compared with a case in which liquid state photoresist is used. As a result, an electroforming mold can be formed without loosing accuracy.

In the method of manufacturing an electroforming mold according to the present invention, in the patterning step, the intermediate conductive film may remain only on a part of the first insoluble portion of the first photoresist layer divided by exposure through the first mask pattern, and in the step of exposing the second photoresist layer, the second mask pattern may be preferably disposed above the second photoresist layer so as to protrude outwardly from the intermediate conductive film.

If the intermediate conductive film remains only on a part of the first insoluble portion of the first photoresist layer, the second photoresist layer can be formed directly on the upper surface of the first photoresist layer with no intermediate conductive film interposed therebetween. That is, the photoresist layers having high affinity and high adhesion are connected to each other. For this reason, an electroforming mold having high strength can be obtained. In addition, the second mask pattern is disposed so as to protrude outwardly from the intermediate conductive film. As a result, in the second photoresist layer exposure step, a convex portion can be prevented from being formed in the inner surface of the electroforming mold due to a diffraction phenomenon at the time of exposure.

In the method of manufacturing an electroforming mold according to the present invention, the thickness of the conductive substrate may be preferably equal to or more than 100 µm and equal to or less than 10 mm, and the thickness of each of the first photoresist layer and the second photoresist layer may be preferably equal to or more than 1 µm and equal to or less than 5 mm.

In the method of manufacturing an electroforming mold according to the present invention, the thickness of the substrate may be preferably equal to or more than 100 µm and equal to or less than 10 mm, the thickness of the bottom conductive film may be preferably equal to or more than 5 nm and equal to or less than 10 µm, and the thickness of each of the first photoresist layer and the second photoresist layer may be preferably equal to or more than 1 µm and equal to or less than 5 mm.

In the method of manufacturing an electroforming mold according to the present invention, before the soluble portion removal step, a series of steps including the intermediate conductive film formation step, the patterning resist formation step, the patterning step, the patterning resist removal step, the second photoresist layer formation step, and the second photoresist layer exposure step may be further performed one or more times.

It is assumed that the second photoresist layer includes a photoresist layer directly above the first photoresist layer and a photoresist layer above the photoresist layer. That is, the layer above the first photoresist layer is called as the second photoresist layer, regardless of a single layer or a multilayer.

As a result, an electroforming mold having a multistage structure of three or more stages, in which a conductive film (electrode) is formed at the bottom of a step portion, as well as the bottom of the mold, can be reliably manufactured.

The electroforming mold according to the present invention includes: a conductive substrate; a first photoresist layer formed on an upper surface of the conductive substrate, the first photoresist layer having a first through hole in a thickness direction thereof; an intermediate conductive film disposed on a part of an upper surface of the first photoresist layer and formed by etching a conductive film; and a second photoresist layer formed on a part of an upper surface of the intermediate conductive film, and having a second through hole disposed above a surface included in the upper surface of the first photoresist layer, the surface including an aperture surface of the first through hole.

According to the electroforming mold of the present invention, because the intermediate conductive film is formed on the upper surface of the first photoresist layer, the intermediate conductive film can be used as an electrode during electroforming, and thus an electroformed component having a multistage structure can be rapidly manufactured. In addition, since the intermediate conductive film is formed by etching, burrs are not easily produced in the end portion of the intermediate conductive film. From this viewpoint, an electroformed component can be manufactured with high accuracy.

The electroforming mold according to the present invention includes: a conductive substrate; a first photoresist layer formed on an upper surface of the conductive substrate, the first photoresist layer having a first through hole in a thickness direction thereof; a second photoresist layer formed on a part of an upper surface of the first photoresist layer, and having a second through hole disposed above a surface included in the upper surface of the first photoresist layer, the surface including an aperture surface of the first through hole; and an intermediate conductive film disposed on the upper surface of the first photoresist layer in the second through hole and formed by etching a conductive film.

According to the electroforming mold of the present invention, because the second photoresist layer is formed directly on the upper surface of the first photoresist layer, the photoresist layers can be bonded to each other with high affinity and high adhesion in addition to the effects of the above-described electroforming mold, and thus an electroforming mold having high strength can be obtained.

In the electroforming mold according to the present invention, when a distance between a side surface defining the second through hole of the second photoresist layer and an outer edge of the intermediate conductive film opposite the side surface is defined to be W6, the distance W6 may be preferably set in a range of 1 µm to 25 µm.

In order to set the distance W6 to a value smaller than 1 µm, a high level of accuracy is demanded, and manufacturing becomes complicated. Meanwhile, if the distance W6 is set to a value more than 25 µm, when an electroformed component is manufactured by using the electroforming mold, an aspect ratio of a space between the deposited metal near the intermediate conductive film and the second photoresist layer increases. The increase in the aspect ratio deteriorates circulation of an electroforming liquid in the corresponding portion. As a result, a "hollow" may be generated in the electroformed component, and the structure of the deposited metal in the corresponding portion may be changed.

In the electroforming mold according to the present invention, when the thickness of the second photoresist layer is defined to be T6, a ratio of the thickness T6 with respect to the distance W6 may be preferably set to a value more than 2.

The reason for this is that a variation in the thickness of an electroformed component can be reduced.

In the electroforming mold according to the present invention, when the thickness of the second photoresist layer is defined to be T6, a ratio of the thickness T6 with respect to the distance W6 may be preferably set to a value more than 5.

The reason for this is that a variation in thickness of an electroformed component can be further reduced, and the amount of additional cutting or grinding can be reduced.

In the electroforming mold according to the present invention, when the thickness of the second photoresist layer is defined to be T6, a ratio of the thickness T6 with respect to the distance W6 may be preferably set to a value more than 10.

The reason for this is that a variation in the thickness of an electroformed component can be significantly reduced, and additional cutting or grinding can be omitted.

In the electroforming mold according to the present invention, an inner edge of the intermediate conductive film may be preferably formed so as to be recessed from an aperture end of the first through hole of the first photoresist layer, and when a width of the intermediate conductive film between the inner edge of the intermediate conductive film toward the aperture end of the first through hole of the first photoresist layer and an outer edge of the intermediate conductive film opposite a side surface, at which the second through hole of the second photoresist layer is formed, is defined to be W7, and the thickness of the second photoresist layer is defined to be T6, the distance W6, the width W7, and the thickness T6 may be preferably set so as to satisfy the following formula:

$$W7-W6>T6.$$

When an electroformed component is manufactured by using the electroforming mold under the above-described condition, a step portion, which is formed by forming the inner edge of the intermediate conductive film so as to be recessed from the aperture end of the first through hole of the first photoresist layer, is not connected to a step portion, which is formed by separating the side surface, at which the second through hole of the second photoresist layer is formed, from the outer edge of the intermediate conductive film. From this viewpoint, the quality of the electroformed component can be prevented from being deteriorated.

If both step portions are connected to each other, a large step portion having a difference in height is formed, and the large step portion deteriorates circulation of the electroforming liquid near the step portion. As a result, a "hollow" may be generated in the electroformed component, and the structure of the deposited metal may be changed.

The method of manufacturing an electroformed component according to the present invention includes: a step of dipping the aforementioned electroforming mold in an electroforming liquid; a step of applying voltage to the conductive substrate; a step of depositing a metal on an exposed surface of the conductive substrate; and a step of bringing a part of the deposited metal into contact with intermediate conductive film to apply a voltage to the intermediate conductive film.

According to the method of manufacturing an electroformed component of the present invention, the intermediate conductive film formed on the upper surface of the first photoresist layer can be used as an electrode during electroforming, and thus an electroformed component having a multistage structure can be rapidly manufactured.

Effects of the Invention

According to the present invention, when a multistage electroformed component is manufactured, instead of forming a mold for forming a next layer on a layer of a component formed by removing resist forming a side wall of an electroforming mold each time a layer is formed, a photoresist layer is formed and exposed to light, and multiple layers are developed in an overlap manner while an intermediate conductive film is interposed between the photoresist layers of the individual stages. In this way, a multistage electroforming mold having an intermediate conductive film at the bottom of each step portion can be manufactured. In addition, according to an electroformed component which is manufactured by using the electroforming mold, it is not necessary to execute electroforming each time a stage is formed, and thus a desired component can be manufactured by a single electroforming process.

When the intermediate conductive film is formed on the upper surface of the first photoresist layer by the vacuum deposition method, a conductive material is thermally deposited within a temperature range in which light with a wavelength within a range not causing photoreaction in the first photoresist layer is emitted. For this reason, the first photoresist layer is not affected by light when the intermediate conductive film is formed. Therefore, before the intermediate conductive film is formed, there is no case in which a step of dividing the first photoresist layer into a soluble portion and an insoluble portion comes to nothing due to exposure through a first mask pattern. As a result, an electroforming mold with a lower step formed to have a desired shape can be manufactured.

A mold is manufactured without forming resist for a next layer on a layer of a component while being formed. For this reason, a mold, for which height control is possible, can be manufactured, and simultaneously an interface between layers of an electroformed component to be manufactured by using the electroforming mold can be prevented from becoming uneven, or a height can be prevented from becoming uneven.

BRIEF DESCRIPTION OF THE DRAWINGS

FIG. 1A is a sectional view showing a first photoresist layer formation step and a first photoresist layer exposure step, FIG. 1B is a sectional view showing an intermediate conductive film formation step, FIG. 1C is a sectional view showing a patterning resist formation step, FIG. 1D is a sectional view showing a patterning step, FIG. 1E is a sectional view showing a patterning resist removal step, FIG. 1F is a sectional view showing a second photoresist layer formation step, and FIG. 1G is a sectional view showing a soluble portion removal step.

FIG. 4A is a sectional view showing an initial process, FIG. 4B is a sectional view showing a halfway step, FIG. 4C is a sectional view showing a later process, and FIG. 4D is a sectional view of an electroformed component manufactured in such a manner.

FIG. 6A is a sectional view showing a first photoresist layer formation step and a first photoresist layer exposure step, FIG. 6B is a sectional view showing an intermediate conductive film formation step, FIG. 6C is a sectional view showing a patterning resist formation step, FIG. 6D is a sectional view showing a patterning step, FIG. 6E is a sectional view showing a patterning resist removal step, FIG. 6F is a sectional view showing a second photoresist layer formation step, and FIG. 6G is a sectional view showing a soluble portion removal step.

FIG. 7A is a sectional view showing a first photoresist layer formation step and a first photoresist layer exposure step, FIG. 7B is a sectional view showing an intermediate conductive film formation step, FIG. 7C is a sectional view showing a patterning resist formation step, FIG. 7D is a sectional view showing a patterning step, FIG. 7E is a sectional view showing a patterning resist removal step, FIG. 7F is a sectional view showing a second photoresist layer formation step, and FIG. 7G is a sectional view showing a soluble portion removal step.

FIG. 22A is a sectional view showing a state where a plurality of electroforming molds are provided in parallel, FIG. 22B is a sectional view showing an initial process, FIG. 22C is a sectional view showing a later process, and FIG. 22D is a sectional view of an electroformed component manufactured in such a manner.

FIG. 23A is a sectional view showing a state where a plurality of electroforming molds are provided in parallel, FIG. 23B is a sectional view showing an initial process, and FIG. 23C is a sectional view showing a later process.

FIG. 24A is a sectional view showing a state where a plurality of electroforming molds are provided in parallel, FIG. 24B is a sectional view showing an initial process, and FIG. 24C is a sectional view showing a later process.

FIG. 25A is a sectional view showing a first photoresist layer formation step and a first photoresist layer exposure step, FIG. 25B is a sectional view showing a state where a first photoresist layer exposure step is completed, FIG. 25C is a sectional view showing an intermediate conductive film formation step, FIG. 25D is a sectional view showing a patterning resist formation step, FIG. 25E is a sectional view showing a patterning step and a patterning resist removal step, FIG. 25F is a sectional view showing a second photoresist layer formation step, FIG. 25G is a sectional view showing a second photoresist layer exposure step, and FIG. 25H is a sectional view showing a soluble portion removal step.

DESCRIPTION OF THE REFERENCE SYMBOLS

Figure 1A:
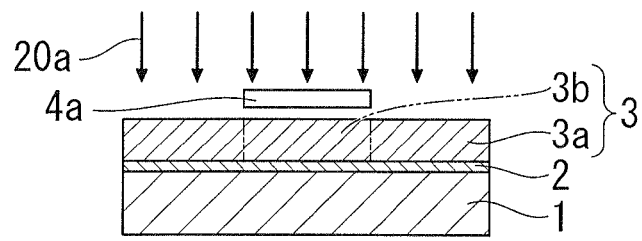
FIGS. 1A to 1G are diagrams showing a method of manufacturing an electroforming mold according to a first embodiment of the invention.

1: substrate
2: bottom conductive film
3: first photoresist layer
3a: insoluble portion
3b: soluble portion
4a: first mask pattern
4c: second mask pattern
5: intermediate conductive film
5a, 5aa, 5ab, 5ac, 5ad: electrode
6: second photoresist layer
6a: insoluble portion
6b: soluble portion
7a: insoluble portion, through pattern
21: electroforming bath
22: electroforming liquid
23: electrode
24: first through hole
25: second through hole
100: electroformed component
100a, 100b: electroformed object
101, 102, 103, 1001, 1002, 1003, 1004: electroforming mold
120, 121: electroformed component
120a, 121a: electroformed object
130: gear
140: first mask pattern
150: second mask pattern

BEST MODE FOR CARRYING OUT THE INVENTION

Hereinafter, embodiments of the invention will be described with reference to FIGS. 1A to 22D and 24A to 28.
First Embodiment FIGS. 1A to 1G are diagrams illustrating a method of manufacturing an electroforming mold according to a first embodiment of the invention in process sequence. FIG. 1A is a sectional view showing a first photoresist layer formation step on a substrate and a first photoresist layer exposure step.

In FIG. 1A, a bottom conductive film 2 is formed on an upper surface of the substrate 1, and a first photoresist layer 3 is formed on an upper surface of the bottom conductive film 2. Thereafter, a first mask pattern 4a is positioned above a portion forming an unexposed region that is a soluble portion 3b described below, and ultraviolet light 20a is irradiated to expose the first photoresist layer 3, to thereby form an insoluble portion 3a that is an exposed region and the soluble portion 3b that is an unexposed region.

The thickness of the substrate 1 is in a range of approximately 100 μm to 10 mm. The thickness of the substrate 1 is set such that an electroforming mold 101 has sufficient strength in an electroforming process or a grinding process described below. The thickness of the bottom conductive film 2 is in a range of approximately 5 nm to 10 μm. The thickness of the bottom conductive film 2 is set such that electricity is conducted in an electroforming process described below. The thickness of the first photoresist layer 3 is in a range of 1 μm to 5 mm, and is substantially the same as the thickness of a first stage of an electroformed object to be produced. As a material of the substrate 1, a material, such as glass or silicon, which is generally used in a silicon process, or a metal material, such as stainless steel or aluminum, is used. Examples of a material of the bottom conductive film 2 include gold (Au), silver (Ag), nickel (Ni), and the like. Chromium (Cr), titanium (Ti), or the like may be formed, between the bottom conductive film 2 and the substrate 1, as an anchor metal (not shown) for strengthening the adhesion force of the bottom conductive film 2. When the material for the substrate 1 is a metal, the bottom conductive film 2 is not necessarily provided. For the first photoresist layer 3, for example, a negative type photoresist is used.

The first photoresist layer 3 may be a chemical amplification type photoresist. In particular, when a structure with a high aspect ratio is produced, for the first photoresist layer 3, an epoxy-type resin-based chemical amplification type photoresist is preferably used. For the first photoresist layer 3, a photoresist, which is insoluble in a developer and a separating liquid of the patterning resist 10 in a development step and a removal step described below, and which is also insoluble in an etchant to be used in patterning of an intermediate conductive film 5, is used.

A formation method of the bottom conductive film 2 may be a sputtering method, a vacuum deposition method, or the like. A formation method of the first photoresist layer 3 may be spin coating, dip coating, spray coating, or a method in which a sheet-like photoresist film is attached to the substrate 1. Alternatively, a plurality of sheet-like photoresist films may be laminated so as to form the first photoresist layer 3 at a desired thickness. In order to form the insoluble portion 3a and the soluble portion 3b, ultraviolet light is emitted through a first mask pattern 4a. When the first photoresist layer 3 is a chemical amplification type, PEB (Post Exposure Bake) is executed after the exposure.

Figure 1B:
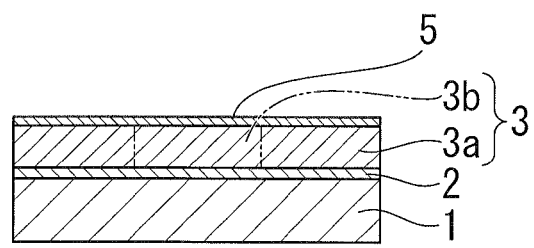

FIG. 1B is a sectional view showing an intermediate conductive film formation step in which an intermediate conductive film is formed on an upper surface of the first photoresist layer 3. After the first photoresist layer exposure step, while development is not executed, a conductive material is thermally deposited by using a vacuum deposition method within a temperature range in which light with a wavelength within a range not causing photoreaction in the first photoresist layer 3 is emitted. Thus, the intermediate conductive film 5 is formed on the upper surface of the first photoresist layer.

Examples of the conductive material include, for example, aluminum (Al), titanium (Ti), chromium (Cr), iron (Fe), cobalt (Co), nickel (Ni), copper (Cu), zinc (Zn), silver (Ag), indium (In), tin (Sn), gold (An), and the like. Of these conductive materials, chromium or titanium may be used as an anchor metal of other conductive materials. In this case, other conductive materials may be formed on the chromium or titanium.

Because a photoresist material which reacts with ultraviolet light is usually used for the first photoresist layer 3, light with a wavelength within a range not causing photoreaction in the first photoresist layer 3 is light with a wavelength longer than the wavelength of ultraviolet light, for example, light with a wavelength equal to or more than 0.4 µm and equal to or less than 30 µm. The reason why the wavelength of light is equal to or more than 0.4 µm is that the wavelength of ultraviolet light is equal to or less than 0.4 µm. In addition, the reason why the wavelength of light is equal to or less than 30 µm is that the conductive material is thermally deposited so as to form the intermediate conductive film 5, and accordingly from the spectral distribution of black-body radiation, it is very difficult to emit light with a wavelength more than 30 µm by heating and melting the conductive material.

The thickness of the intermediate conductive film 5 is in a range of several nanometers to several micrometers. The thickness of the intermediate conductive film 5 is set such that electricity is conducted in an electroforming process described below.

In setting the heating temperature range of the conductive material, in which light with a wavelength within a range not causing photoreaction in the first photoresist layer 3 is emitted, the following three types of settings may be adopted. In a first type of setting, an evaporation temperature in a vacuum of the conductive material for the intermediate conductive film 5 is taken into consideration. In a second type of setting, an evaporation temperature in a vacuum of the conductive material for the anchor metal is taken into consideration. In a third type of setting, workability or availability is taken into consideration.

In the first type of setting, the heating temperature range is from 170° C. to 2000° C. The reason why the upper limit is set to 2000° C. is that at 0.4 µm, which is the photosensitive wavelength of the first photoresist layer 3, strength distribution is obtained from the maximum value of a temperature of the conductive material (the above-described material, such as aluminum (Al), titanium (Ti), chromium (Cr), or the like), which can be used to form the intermediate conductive film 5, at the time of evaporation in a vacuum by a theoretical formula of black-body radiation, and the result is confirmed through experiment. In the experiment, tungsten is used as the material of the crucible, and it is confirmed that, even though the crucible is heated to 2000° C. while the temperature of the crucible is measured by a pyrometer (high-temperature thermometer), a subsequent process flow is possible while the first photoresist layer 3 is not affected.

Meanwhile, when molybdenum, which can be deposited at a temperature lower than tungsten, is used as the material of the crucible, since molybdenum evaporates at 1800° C., it is necessary to set the upper limit to a temperature lower than 1800° C., such as, for example, 1700° C.

The reason why the lower limit is set to 170° C. is that a case in which zinc (Zn), which evaporates at the lowest temperature of the conductive materials for the intermediate conductive film 5, is deposited is taken into consideration.

In the second type of setting, the temperature range is from 600° C. to 1500° C. The reason why the upper limit is set to 1500° C. is that the upper limit temperature of a material, which is to be used at high probability, at the time of a vacuum deposition is taken into consideration. Examples of the materials of the anchor metal include chromium (Cr) and titanium (Ti), and examples the materials which are to be formed at high probability on the anchor metal include silver (Ag), gold (Au), copper (Cu), aluminum (Al), iron (Fe), and nickel (Ni). Meanwhile, the reason why the lower limit is set to 600° C. is that, on an assumption that, since the lower limit value of zinc (Zn) among the conductive materials, which can be used for the intermediate conductive film 5, is lowest, materials other than zinc are used, and the temperature of the materials at the time of vacuum deposition is taken into consideration.

In the third type of setting, the temperature range is from 800° C. to 1200° C. The reason why such a temperature range is set is that on an assumption that, in terms of good workability and availability, chromium (Cr) is used as the anchor metal, and copper (Cu) or gold (Au) is used as the material which is formed on the anchor metal, and the temperature of the materials at the time of vacuum deposition is taken into consideration.

Figure 1C:
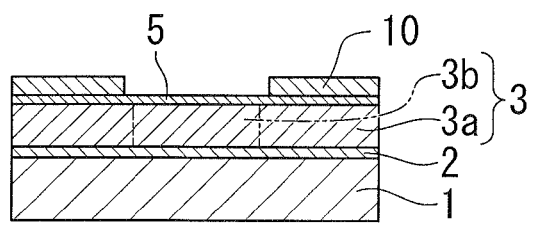

FIG. 1C is a sectional view showing a patterning resist formation step in which a patterning resist 10 is formed on an upper surface of the intermediate conductive film. As shown in FIG. 1C, the patterning resist 10 is formed on the upper surface of the intermediate conductive film 5 so as to have a predetermined shape.

In this case, the patterning resist 10 is positioned and formed so as to cover only the insoluble portion 3a of the first photoresist layer 3. Specifically, the patterning resist 10 is positioned and formed so as to cover a region recessed from the boundary between the insoluble portion 3a and the soluble portion 3b toward the insoluble portion 3a by a distance equal to or more than 1 µm and equal to or less than 500 µm with respect to the insoluble portion 3a of the first photoresist layer 3.

As a formation method of the patterning resist 10, for example, a photoresist layer may be formed, exposed, and developed. The photoresist layer may be a negative type or a positive type. A formation method of the photoresist layer, spin coating, dip coating, or the like may be used. Dry film resist, in which photoresist is formed on a film, may be laminated. A temperature when the dry film resist is laminated is preferably lower than a lower one of the glass transition points of the insoluble portion 3a and the soluble portion 3b of the first photoresist layer 3.

The dry film resist includes no organic solvent. For this reason, there is little possibility that the insoluble portion 3a and the soluble portion 3b of the first photoresist layer 3 may be dissolved, when compared with a case in which liquid state photoresist is used. Therefore, an electroforming mold can be stably formed.

The dry film resist is laminated while being heated and pressurized. If the dry film resist is laminated at a temperature lower than a lower one of the glass transition points of the insoluble portion 3a and the soluble portion 3b of the first photoresist layer 3, the dry film resist can be coated without deforming the insoluble portion 3a, the soluble portion 3b, and the intermediate conductive film 5. Therefore, the flatness of the insoluble portion 3a, the soluble portion 3b, and the intermediate conductive film 5 can be maintained. In this way, if the flatness of the insoluble portion 3a, the soluble portion 3b, and the intermediate conductive film 5 is maintained, the dry film resist can be patterned with a high level of accuracy. When a second photoresist layer 6 described below is formed on the upper surfaces of the insoluble portion 3a, the soluble portion 3b, and the intermediate conductive film 5, since the upper surfaces of the insoluble portion 3a and the like have little unevenness, good thickness controllability of the second photoresist layer 6 is obtained. In addition, the surface roughness of a portion of an electroformed component to be finally formed in contact with the insoluble portion 3a and the electrode 5a can be reduced, and the appearance of the electroformed component can be improved.

Figure 1D:
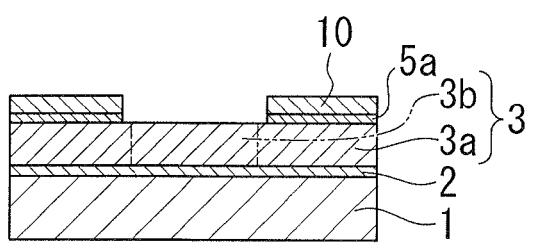

FIG. 1D is a sectional view showing a patterning step in which the intermediate conductive film 5 is patterned through the patterning resist 10. As shown in FIG. 1D, after the patterning resist 10 is formed, the intermediate conductive film 5 is patterned with the patterning resist 10 as an etching mask, to thereby obtain the electrode 5a. In patterning the intermediate conductive film 5, etching is performed by using an etchant depending on the material of the intermediate conductive film 5.

Figure 1E:
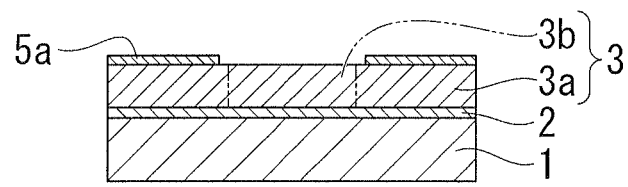

FIG. 1E is a sectional view showing a patterning resist removal step in which the patterning resist 10 remaining after the patterning step is removed. As shown in FIG. 1E, the patterning resist 10 on the electrode 5a (intermediate conductive film 5) is removed. In removing the patterning resist 10, a separating liquid is used. As the separating liquid, an alkaline or acid aqueous solution is used. Preferably, an organic solvent is not used since it dissolves the soluble portion 3b.

Figure 1F:
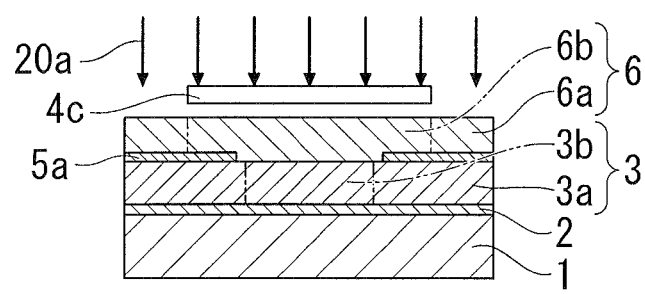

FIG. 1F is a sectional view showing a second photoresist layer formation step in which a second photoresist layer is formed on an exposed upper surface of the first photoresist layer by the patterning step and an exposed upper surface of the electrode 5a (intermediate conductive film 5) by the patterning resist removal step, and a second photoresist layer exposure step in which the second photoresist layer is exposed through a second mask pattern 4c disposed above the second photoresist layer to divide the second photoresist layer into a soluble portion and an insoluble portion. As shown in FIG. 1F, first, the second photoresist layer 6 is formed on the upper surface of the electrode 5a, and the exposed upper surfaces of the soluble portion 3b and the insoluble portion 3a by the patterning resist removal step. Next, the second mask pattern 4c is positioned so as to cover the soluble portion 3b and to extend to the insoluble portion 3a. That is, the second mask pattern 4c is disposed such that a part of an upper portion of a surface in contact with the electrode 5a with respect to the second photoresist layer 6 is exposed. Specifically, the second mask pattern 4c, which is larger than an etched aperture of the electrode 5a, is disposed so as to be positioned above a surface opposite a surface in contact with an unexposed region of the first photoresist layer 3.

Next, after the second mask pattern 4c is disposed, ultraviolet light 20a is irradiated to expose the second photoresist layer 6, to thereby form an insoluble portion 6a and a soluble portion 6b.

The thickness of the second photoresist layer 6 is in a range of approximately 1 μm to 5 mm, and is substantially the same as the thickness of a second stage of an electroformed object to be produced. For the second photoresist layer 6, a negative type photoresist is used. The second photoresist layer 6 may be a chemical amplification type photoresist. When a structure with a high aspect ratio is manufactured, for the second photoresist layer 6, an epoxy-type resin-based chemical amplification type photoresist is preferably used. The second photoresist layer 6 is preferably made of the same material as that of the first photoresist layer 3 so as to be developed by the same developer in a development process described below, but the second photoresist layer 6 may be formed of a material different from that of the first photoresist layer 3. A formation method of the second photoresist layer 6 may be spin coating, dip coating, spray coating, or a method in which a sheet-like photoresist film is adhered onto the electrode 5a. Alternatively, a plurality of sheet-like photoresist films may be laminated so as to form the second photoresist layer 6 at a desired thickness. When the second photoresist layer 6 is a chemical amplification type, PEB (Post Exposure Bake) is executed after the exposure.

Figure 1G:
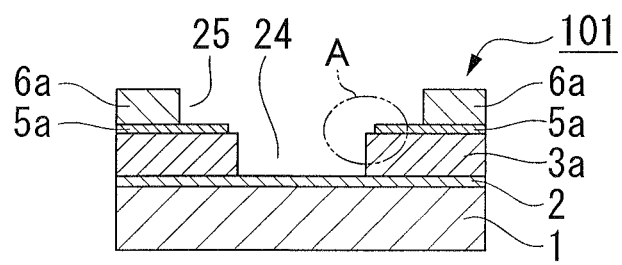

FIG. 1G is a sectional view showing a soluble portion removal step in which the first photoresist layer 3 and the second photoresist layer 6 are developed to remove the soluble portion of each of the first and second photoresist layers. As shown in FIG. 1G, the first photoresist layer 3 and the second photoresist layer 6 are developed to remove the soluble portions 3b and 6b. The development is performed by dipping the substrate 1 having the first photoresist layer 3 and the second photoresist layer 6 in a developer.

As the result of the above-described process, the electroforming mold 101 is obtained which has the bottom conductive film 2 formed on the substrate 1, the first photoresist layer 3 formed on a surface (upper surface) opposite a surface of the bottom conductive film 2 in contact with the substrate 1, the first photoresist layer 3 having a first through hole 24 in a thickness direction thereof, the electrode 5a (intermediate conductive film 5) formed on a part of a surface (upper surface) opposite a surface of the first photoresist layer 3 in contact with the bottom conductive film 2, and the second photoresist layer 6 formed on a part of a surface (upper surface) opposite to a surface of the electrode 5a in contact with the first photoresist layer 3, the second photoresist layer 6 having a second through hole 25 disposed above a surface, included in the upper surface of the first photoresist layer 3, including an aperture surface of the first through hole 24.

The electrode 5a is formed by etching the intermediate conductive film 5. Therefore, burrs are not easily produced at the end portion of the electrode 5a.

Figure 2A:
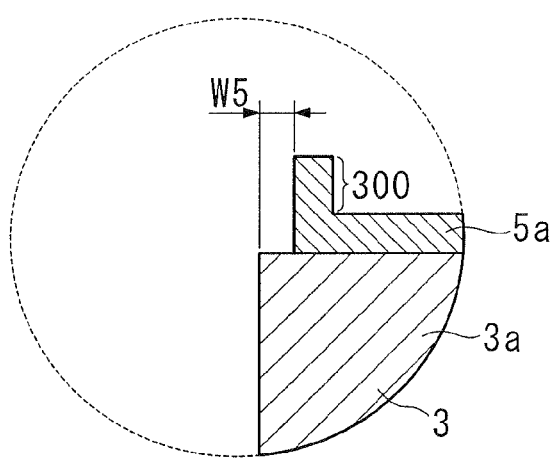
FIGS. 2A to 2C are diagrams for comparison with the first embodiment, and sectional views showing a case in which an electrode is formed by using a lift-off method.
Figure 2B:
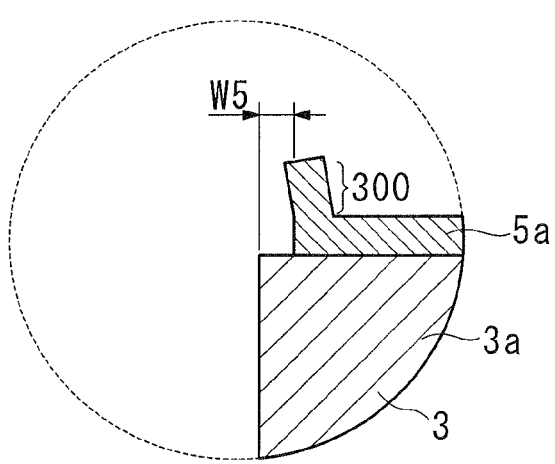
Figure 2C:
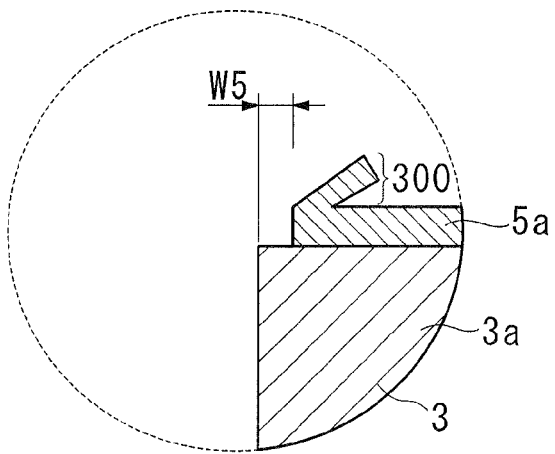
Figure 3:
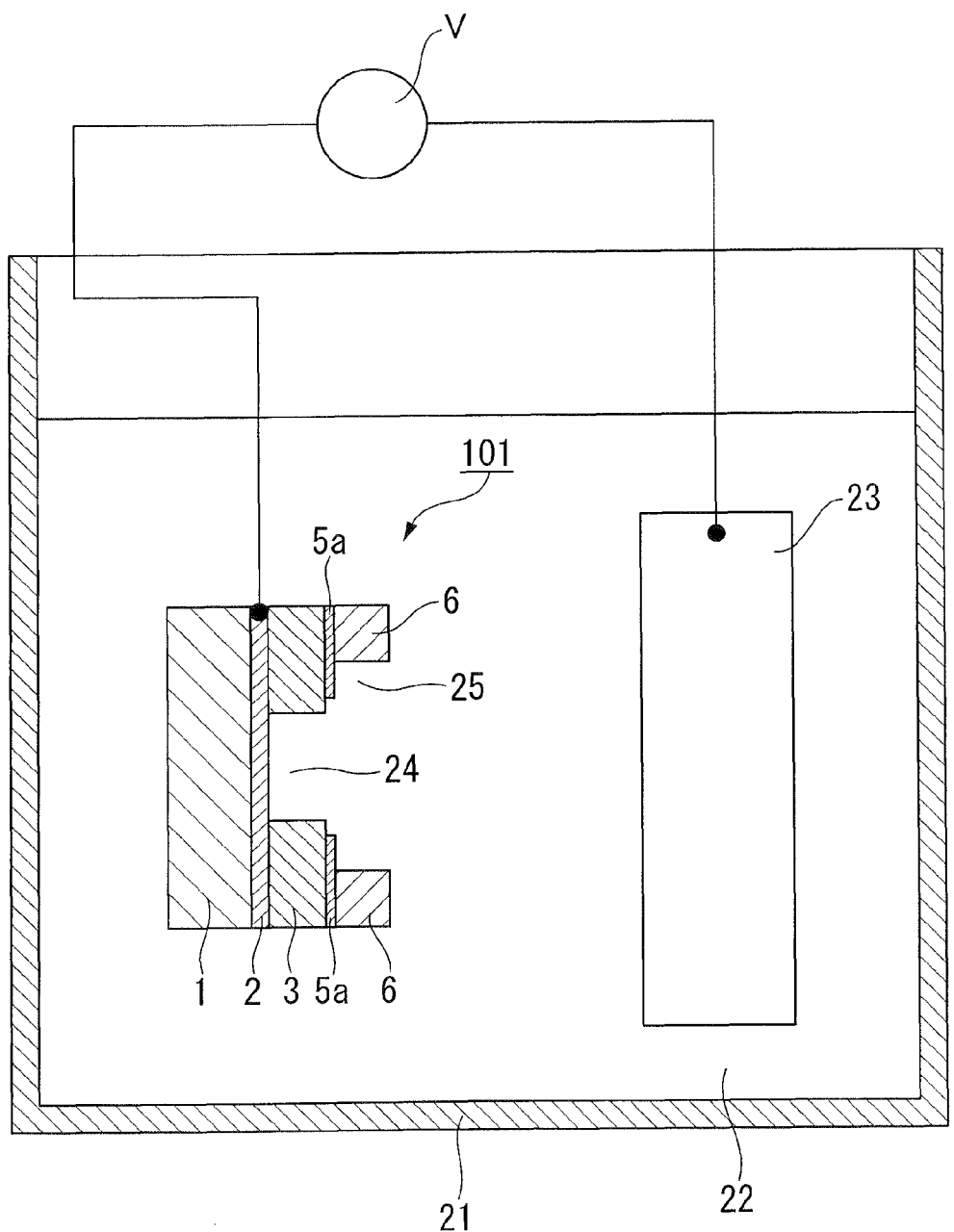
FIG. 3 is a diagram showing an electroforming method in the first embodiment.

When an electrode is formed by using a lift-off method, instead of etching, as shown in FIGS. 2A to 2C, an unnecessary intermediate conductive film 5 is separated from the first photoresist layer 3, together with the base. For this reason, a burr 300 is easily produced in the end portion of the remaining electrode 5a. FIGS. 2A to 2C are sectional views showing a case in which an intermediate conductive film 5 is formed by using a lift-off method. In this case, during electroforming, an electric field is concentrated at the burr 300, and an electroformed portion near the burr is thickened. As a result, the accuracy of an electroformed component to be manufactured may deteriorates.

Figure 5:
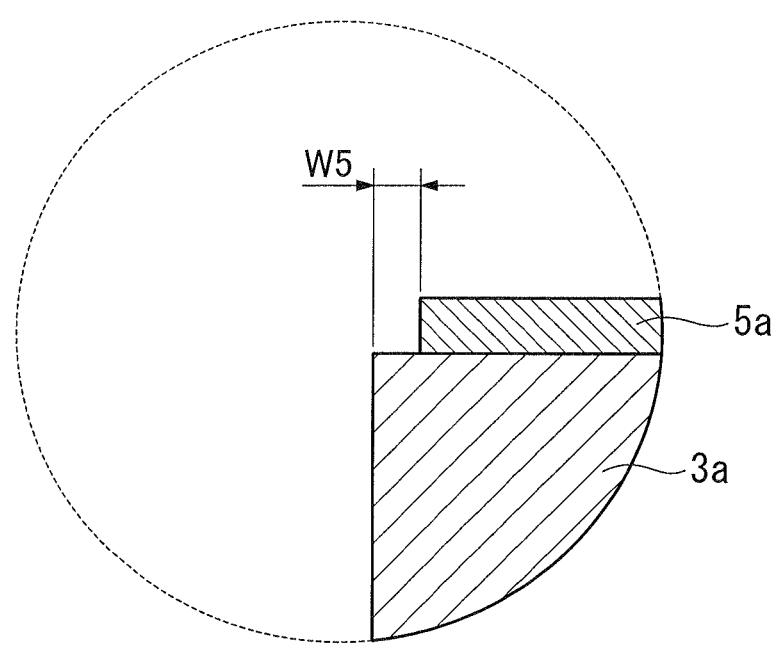
FIG. 5 is an enlarged view of a portion A in FIG. 1G.

The second through hole 25 is formed above a surface, among the upper surfaces of the first photoresist layer 3, including an end portion of the aperture surface of the first through hole 24. That is, when the second through hole 25 is viewed from above, the positional relationship is established in which the first through hole 24 is positioned inside the second through hole 25. When the patterning resist 10 is disposed, the patterning resist 10 is disposed so as to cover a region recessed from the boundary between the insoluble portion 3a and the soluble portion 3b toward the insoluble portion 3a by a distance equal to or more than 1 μm and equal to or less than 500 μm with respect to the insoluble portion 3a of the first photoresist layer 3. For this reason, the electrode 5a (intermediate conductive film 5) is formed so as to have an end portion separated from a surface, at which the first through hole 24 is formed. That is, as shown in FIG. 5 (an enlarged view of a portion A in FIG. 1G), the electrode 5a on the insoluble portion 3a has a shape recessed from an end surface of the insoluble portion 3a. The width W5 of the recessed portion of the electrode 5a is equal to or more than 1 μm.

As a combination of photosensitive materials, as described above, the first photoresist layer 3 and the second photoresist layer 6 are preferably formed of a negative type photoresist material. This is because the soluble portion 3b is not affected by exposure of the second photoresist layer 6 of FIG. 1F, and thus an exposed photoresist is not influenced by a subsequence exposure step. In principle, the patterning resist 10 may be a positive type or a negative type, but when a negative type photoresist material is used for the first photoresist layer 3, preferably, the patterning resist 10 is also a negative type. When the intermediate conductive film 5 has such a small thickness as to float light to some extent, if a positive type photoresist material is used for the first photoresist layer 3, the first photoresist layer 3 is influenced when the patterning resist is exposed.

Other than the combination of the above-described photosensitive materials, the first photoresist layer 3 and the second photoresist layer 6 may be formed of a positive type photoresist, instead of a negative type photoresist.

In this embodiment, the intermediate conductive film 5 is disposed on the first photoresist layer 3 in a single stage, and the second photoresist layer 6 is disposed on the intermediate conductive film 5 in a single stage, but the invention is not limited thereto. The intermediate conductive film 5 and the overlying second photoresist layer 6 may be laminated in two or more stages. In this way, an electroforming mold having three or more stages can be obtained.

FIGS. 4A to 4D are sectional views illustrating an electroforming method when an electroformed component 100 is manufactured by using the electroforming mold 101, which is manufactured by the above-described manufacturing method.

An electroforming bath 21 is filled with an electroforming liquid 22, and the electroforming mold 101 and an electrode 23 are dipped in the electroforming liquid 22. The electroforming liquid 22 to be used varies depending on the metal to be deposited. For example, when nickel is to be deposited, an aqueous solution containing nickel sulfamate hydrated salt is used. The material of the electrode 23 is substantially the same as the metal to be deposited. When nickel is to be deposited, a nickel plate or a titanium basket containing nickel balls is used as the electrode 23.

A material to be deposited by the manufacturing method of the invention is not limited to nickel. The method can be applied to all the materials capable of electroforming, such as copper (Cu), cobalt (Co), tin (Sn), and the like. The bottom conductive film 2 of the electroforming mold 101 is connected to a power source V. Electrons are supplied through the bottom conductive film 2 by the voltage of the power source V, and accordingly a metal is gradually deposited from the bottom conductive film 2. The deposited metal grows in a thickness direction of the substrate 1.

Figure 4A:
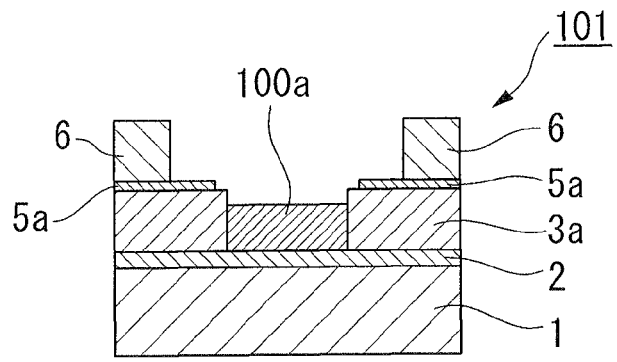
FIGS. 4A to 4D are diagrams showing a process for manufacturing an electroformed component in the first embodiment.
Figure 4B:
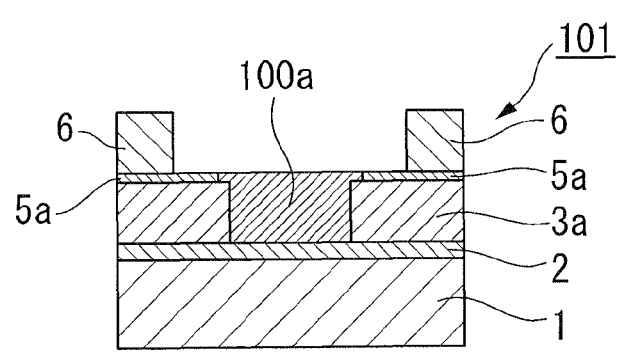
Figure 4C:
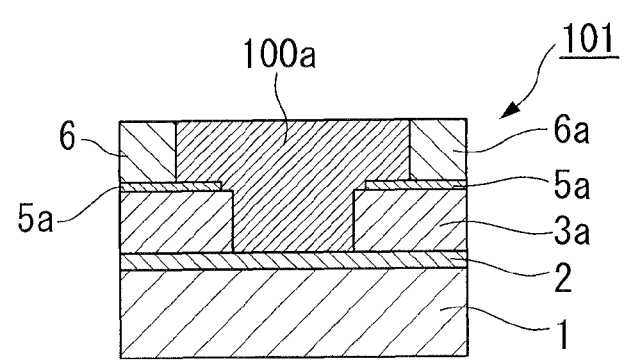
Figure 4D:
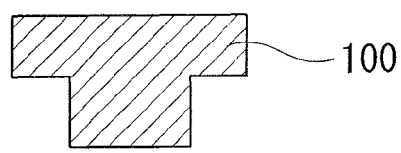

FIGS. 4A to 4D are diagrams showing a process for manufacturing an electroformed component 100 by using the electroforming mold 101 according to the first embodiment of the invention. FIG. 4A is a sectional view showing an initial process in which an electroformed object (metal) 100a is deposited from the upper surface of the bottom conductive film 2. FIG. 4B is a sectional view showing a state where the electroformed object (metal) 100a is deposited from the upper surface of the bottom conductive film 2 and reaches the electrode 5a. FIG. 4C is a sectional view showing a state where the electroformed object (metal) 100a is deposited from the upper surface of the bottom conductive film 2 and reaches the upper surface of the second photoresist layer 6. FIG. 4D is a sectional view of the electroformed component 100 taken out from the electroforming mold 101.

First, as shown in FIG. 4A, the electroformed object (metal) 100a is deposited from the upper surface of the bottom conductive film 2 exposed by the electroforming method described with reference to FIGS. 2A to 2C. In this case, since no current flows to the electrode 5a, the electroformed object 100a is not deposited on the electrode 5a.

Next, as shown in FIG. 4B, the electroformed object 100a grows by the thickness of the insoluble portion 3a, and the electroformed object 100a further grows so as to come into contact with the electrode 5a. In this case, no current flows to the electrode 5a until the electroformed object 100a grows by the thickness of the insoluble portion 3a. For this reason, the electroformed object 100a is not deposited on the electrode 5a. As shown in FIG. 4B, however, if the electrode 5a and the electroformed object 100a are in contact with each other, current starts to flow in the electrode 5a, and accordingly, the electroformed object 100a starts to be deposited on the electrode 5a. The moment that the electroformed object 100a comes into contact with the electrode 5a, the voltage of the power source or current may be changed such that the current density becomes constant.

Next, as shown in FIG. 4C, the electroformed object 100a is deposited to a desired thickness. After the electroformed object 100a is deposited to a desired thickness, the thickness of the electroformed object 100a is uniformed by a grinding process.

When thickness control of the electroformed object 100a is possible in an electroforming process, no grinding process may be executed.

Next, as shown in FIG. 4D, the electroformed object 100a is taken out from the electroforming mold 101 to obtain the electroformed component 100. The takeout of the electroformed object 100a may be executed by dissolving the insoluble portion 3a and the insoluble portion 6a with an organic solvent or by tearing off physically by applying a force to the electroformed object 100a so as to separate the electroformed object 100a from the substrate 1. When the mold is not reused, the mold may be destroyed to take out the electroformed object 100a.

When the bottom conductive film 2 and the electrode 5a are attached to the electroformed object 100a, they are removed by using such a method as wet etching or grinding. When attachment of the bottom conductive film 2 or the electrode 5a arises no problem against the function of the component, the bottom conductive film 2 or the electrode 5a may not be removed. When the bottom conductive film 2 or the electrode 5a is necessary from the viewpoint of the function of the component, the bottom conductive film 2 or the electrode 5a is not removed.

Second Embodiment

FIGS. 6A to 6G are diagrams illustrating a method of manufacturing an electroforming mold 102 according to a second embodiment of the invention. In the second embodiment, the same parts as the constituent elements in the first embodiment are represented by the same reference numerals, and descriptions thereof will be omitted.

Figure 6A:
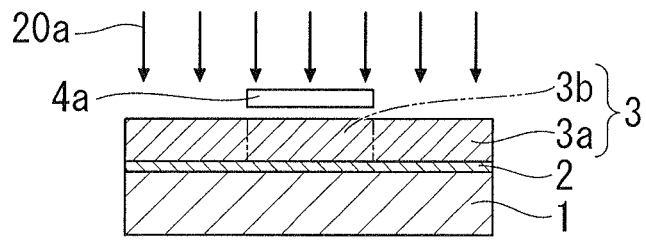
FIGS. 6A to 6G are diagrams showing a method of manufacturing an electroforming mold according to a second embodiment of the invention.

FIG. 6A is a sectional view showing a first photoresist layer formation step on a substrate and a first photoresist layer exposure step in the second embodiment. As shown in FIG. 6A, first, a bottom conductive film 2 is formed on an upper surface of the substrate 1, and a first photoresist layer 3 is formed on an upper surface of the bottom conductive film 2. Thereafter, a first mask pattern 4a is positioned above a portion where a soluble portion 3b is to be formed, and ultraviolet light 20a is irradiated to expose the first photoresist layer 3, to thereby form an insoluble portion 3a and a soluble portion 3b. For the first photoresist layer 3, a negative type photoresist is used.

Figure 6B:
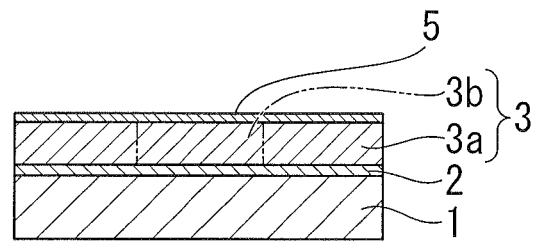

FIG. 6B is a sectional view showing an intermediate conductive film formation step in the second embodiment. After the step described with reference to FIG. 6A, as shown in FIG. 6B, while development is not executed, a conductive material is thermally deposited by using a vacuum deposition method within a temperature range in which light with a wavelength within a range not causing photoreaction in the first photoresist layer 3 is emitted. Thus, an intermediate conductive film 5 is formed on the upper surface of the first photoresist layer 3.

Figure 6C:
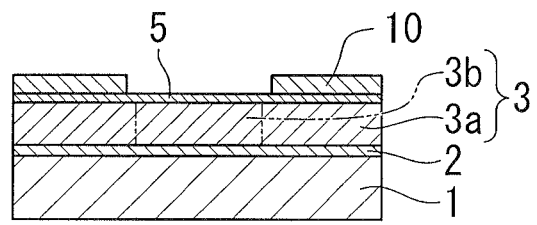

FIG. 6C is a sectional view showing a patterning resist formation step in the second embodiment. As shown in FIG. 6C, a patterning resist 10 is formed on an upper surface of the intermediate conductive film 5 to have a predetermined shape.

Figure 6D:
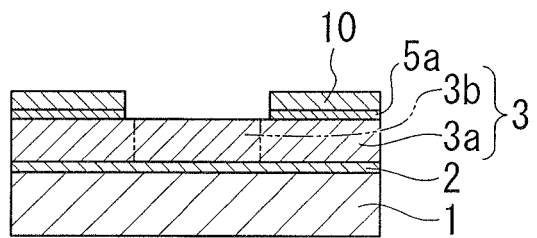

FIG. 6D is a sectional view showing a patterning step in the second embodiment. As shown in FIG. 6D, after a patterning resist 10 is formed, the intermediate conductive film 5 is patterned with the patterning resist 10 as an etching mask, to thereby obtain an electrode 5a. In patterning the intermediate conductive film 5, etching is performed by using an etchant depending on the material for the intermediate conductive film 5.

Figure 6E:
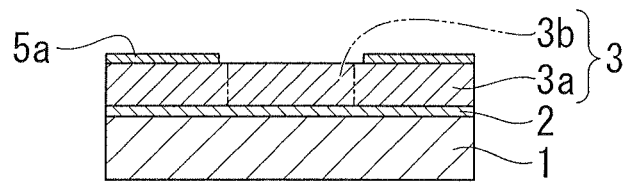

FIG. 6E is a sectional view showing a patterning resist removal step in the second embodiment. As shown in FIG. 6E, the patterning resist 10 on the electrode 5a (intermediate conductive film 5) is removed. In removing the patterning resist 10, a separating liquid is used. As the separating liquid, an alkaline or acid aqueous solution is used. Preferably, an organic solvent is not used since it dissolves the soluble portion 3b.

Figure 6F:
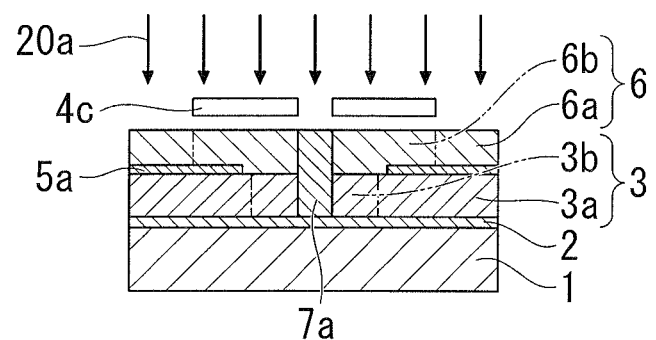

FIG. 6F is a sectional view showing a second photoresist layer formation step and a second photoresist layer exposure step in the second embodiment. As shown in FIG. 6F, a second photoresist layer 6 is formed on an upper surface of the electrode 5a, and an upper surface of the soluble portion 3b and a part of an upper surface of the insoluble portion 3a exposed by the step of FIG. 6E. In this embodiment, for the second photoresist layer 6, a negative type photoresist is used. Next, a second mask pattern 4c is positioned above a portion where the soluble portion of the second photoresist layer 6 is to be formed, and exposure is executed to form an insoluble portion 7a, which is formed through the insoluble portion 6a and the soluble portion 6b, and the second photoresist layer 6 and the soluble portion 3b.

Figure 6G:
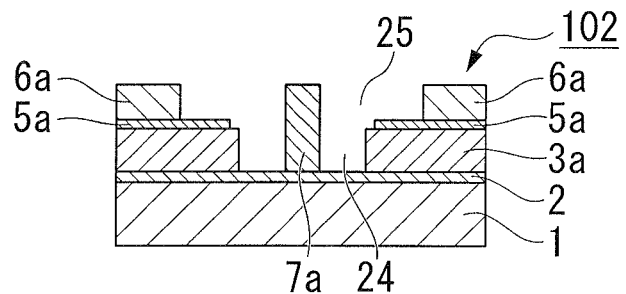

FIG. 6G is a sectional view showing a soluble portion removal step in the second embodiment. As shown in FIG. 6G, by forming an insoluble portion 7a of a through pattern in an exposure process of a second stage, the through pattern 7a can be formed with no misalignment between the first stage and the second stage.

As the result of the above-described process, the electroforming mold 102 that is the same as the electroforming mold 101 obtained in the first embodiment and has a through pattern 7a formed in the through holes 24 and 25 is obtained. When an electroformed component is formed by using the electroforming mold 102, a hollow portion coaxial for respective stages is formed at the center of the electroformed component.

Third Embodiment

FIGS. 7A to 7G are diagrams illustrating a method of manufacturing an electroforming mold 103 according to a third embodiment of the invention. In the third embodiment, the same parts as the constituent elements in the first embodiment are represented by the same reference numerals, and descriptions thereof will be omitted.

Figure 7A:
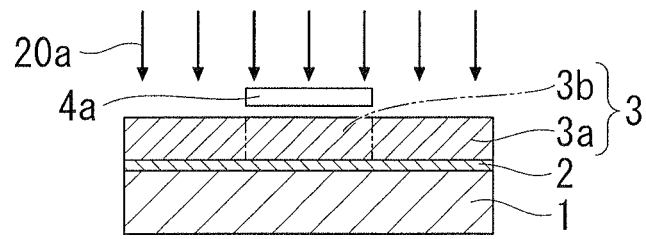
FIGS. 7A to 7G are diagrams showing a method of manufacturing an electroforming mold according to a third embodiment of the invention.

FIG. 7A is a sectional view showing a first photoresist layer formation step on a substrate and a first photoresist layer exposure step in the third embodiment. As shown in FIG. 7A, first, a bottom conductive film 2 is formed on an upper surface of a substrate 1, and a first photoresist layer 3 is formed on an upper surface of the bottom conductive film 2. Thereafter, a first mask pattern 4a is positioned above a portion where an unexposed region that is a soluble portion 3b is to be formed, and ultraviolet light 20a is irradiated to expose the first photoresist layer 3, to thereby form an insoluble portion 3a that is an exposed region and the soluble portion 3b that is an unexposed region. In this embodiment, for the first photoresist layer 3, a negative type photoresist is used.

Figure 7B:
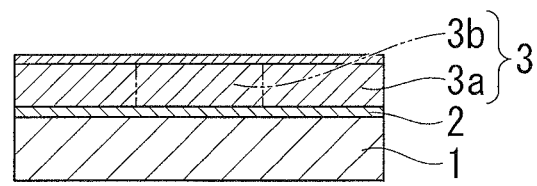

FIG. 7B is a sectional view showing an intermediate conductive film formation step in the third embodiment. After the step described with reference to FIG. 7A, as shown in FIG. 7B, while development is not executed, a conductive material is thermally deposited by using a vacuum deposition method within a temperature range in which light with a wavelength within a range not causing photoreaction in the first photoresist layer 3 is emitted. Thus, an intermediate conductive film 5 is formed on an upper surface of the first photoresist layer 3.

Figure 7C:
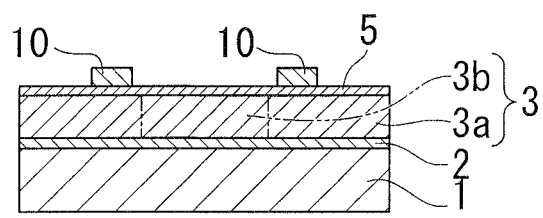

FIG. 7C is a sectional view showing a patterning resist formation step in the third embodiment. As shown in FIG. 7C, patterning resists 10a and 10b are formed on an upper surface of the intermediate conductive film 5 to have a predetermined shape.

In this case, the patterning resists 10a and 10b are positioned and formed so as to cover only the insoluble portion 3a of the first photoresist layer 3. Specifically, the patterning resists 10a and 10b are positioned and formed so as to cover a region recessed from the boundary between the insoluble portion 3a and the soluble portion 3b toward the insoluble portion 3a by a predetermined distance with respect to the insoluble portion 3a of the first photoresist layer 3, and not to overlap an insoluble portion 6a of a second photoresist layer described below.

Figure 7D:
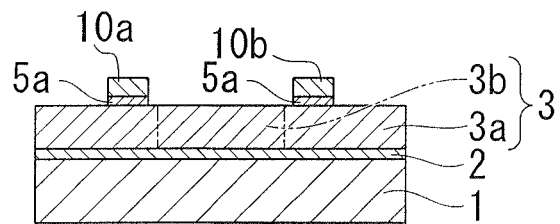

FIG. 7D is a sectional view showing a patterning step in the third embodiment. As shown in FIG. 7D, after the patterning resists 10a and 10b are formed, the intermediate conductive film 5 is patterned with the patterning resists 10a and 10b as an etching mask, to thereby obtain an electrode 5a.

Figure 7E:
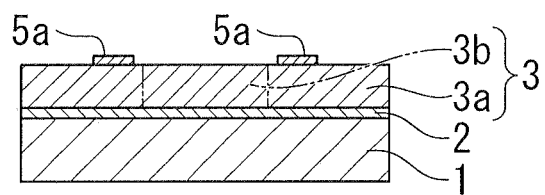

FIG. 7E is a sectional view showing a patterning resist removal step in the third embodiment. As shown in FIG. 7E, the patterning resist 10 on the intermediate conductive film 5 is removed. In removing the patterning resist 10, a separating liquid is used. As the separating liquid, an alkaline or acid aqueous solution is used. Preferably, an organic solvent is not used since it dissolves the soluble portion 3b.

Figure 7F:
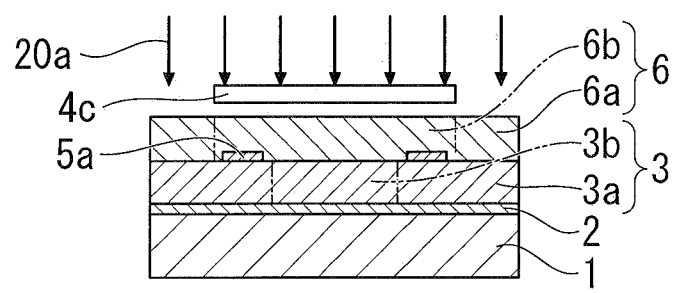

FIG. 7F is a sectional view showing a second photoresist layer formation step and a second photoresist layer exposure step in the third embodiment. As shown in FIG. 7F, a second photoresist layer 6 is formed on an upper surface of the electrode 5a and the upper surface of the first photoresist layer 3 exposed by the step of FIG. 7E. Next, a second mask pattern 4c is disposed so as to cover the soluble portion 3b and the electrode 5a and to extend to a region of the insoluble portion 3a where the electrode 5a is not formed, that is, so as to protrude outwardly from the electrode 5a. The second mask pattern 4c is preferably disposed as described above, but the second mask pattern 4c is not necessarily disposed in such a manner. What is necessary is that the second mask pattern 4c is disposed so as to cover an end portion of the electrode 5a on the soluble portion 3b side. The second mask pattern 4c may be disposed so as to cover a region to the end portion of the electrode 5a on the insoluble portion 3a side, or may be disposed so as to cover the region of the electrode 5a, though not completely. In this embodiment, as the second photoresist layer 6, a negative type photoresist is used.

Next, ultraviolet light 20a is irradiated from above the second mask pattern 4c. Ultraviolet light 20a is irradiated onto the second photoresist layer 6 through the second mask pattern 4c, to thereby form an insoluble portion 6a that is an exposed region and a soluble portion 6b that is an unexposed region.

Figure 7G:
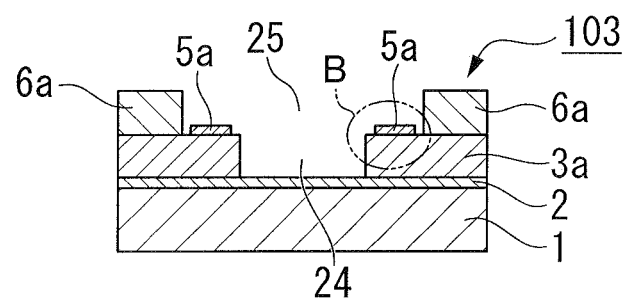

FIG. 7G is a sectional view showing a soluble portion removal step in the third embodiment. As shown in FIG. 7G, development is executed to remove the soluble portions 3b and 6b. The development is performed by dipping the substrate of FIG. 7F having the first photoresist layer 3 and the second photoresist layer 6 in a developer.

As the result of the above-described process, the electroforming mold 103 is obtained which has the substrate 1, a bottom conductive film 2 formed on the upper surface of the substrate 1, the first photoresist layer 3 formed on the upper surface of the bottom conductive film 2, the first photoresist layer 3 having a through hole 24 in the thickness direction thereof, the second photoresist layer 6 formed on a part of the upper surface of the first photoresist layer 3, the second photoresist layer 6 having a second through hole 25 formed to pass through in the thickness direction thereof above the first through hole 24, and the electrode 5a (intermediate conductive film 5) formed inside the second through hole 25 and on the upper surface of the first photoresist layer 3. The electrode 5a (intermediate conductive film 5) is formed so as to be separated from the second photoresist layer 6 by a predetermined distance W6. The electrode 5a is formed by etching the intermediate conductive film, instead of a list-off method.

Figure 8:
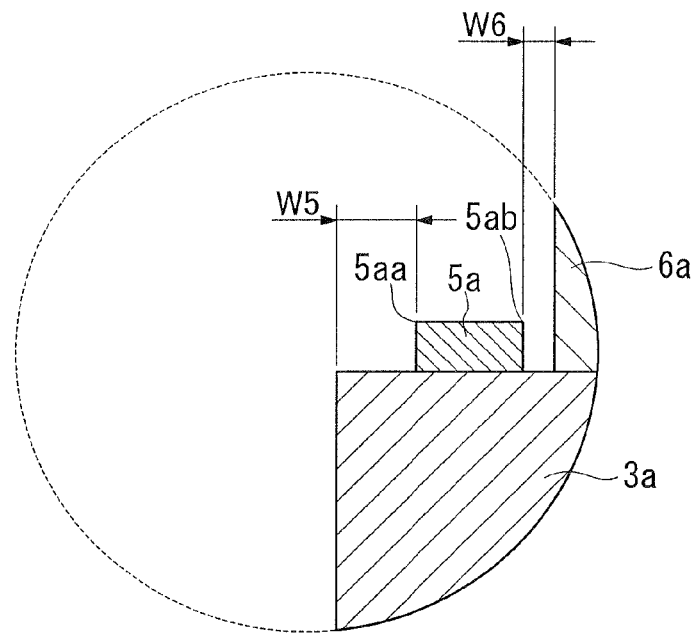
FIG. 8 is an enlarged view of a portion B in FIG. 7G

FIG. 8 is an enlarged view of a portion B in FIG. 7G. In the third embodiment, in the step of FIG. 7F, the second mask pattern 4c is disposed so as to cover the soluble portion 3b and the electrode 5a and to extend to the region of the insoluble portion 3a where the electrode 5a is not formed. For this reason, as shown in FIG. 8, the electrode 5a is disposed so as to be separated from the insoluble portion 6a by the predetermined distance W6. That is, a side surface at which the second through hole 25 of the second photoresist layer 6 is formed is separated from an outer edge 5ab of the electrode 5a opposite the side surface by the predetermined distance W6.

As described above, when the electrode 5a is formed on the upper surface of the insoluble portion 3a so as to be separated from the insoluble portion 6a such that the electrode 5a does not come into contact with the insoluble portion 6a, the insoluble portion 3a comes into direct contact with the insoluble portion 6a.

The insoluble portion 3a and the insoluble portion 6a are formed of photoresist materials, and they have high affinity and high adhesion. Therefore, the insoluble portion 3a and the insoluble portion 6a can be strongly connected to each other, and thus the electroforming mold 103 having high strength can be obtained.

In the third embodiment, in the step of FIG. 7B, the patterning resists 10a and 10b are disposed such that the patterning resists 10a and 10b cover the region recessed from the boundary between the insoluble portion 3a and the soluble portion 3b toward the insoluble portion 3a by the predetermined distance with respect to the insoluble portion 3a of the first photoresist layer 3. For this reason, as shown in FIG. 8, an inner edge 5aa of the electrode 5a is disposed so as to be recessed from an end surface of the insoluble portion 3a (that is, an aperture end of the first through hole 24) by a distance W5 (a state of being separated by a predetermine distance W5).

When the end portion of the electrode 5a is disposed on the same plane as the end surface of the insoluble portion 3a, an electric field is concentrated at the end portion of the upper surface of the electrode 5a, and accordingly an electroformed object of the corresponding portion may be thickened. In contrast, if the end portion of the electrode 5a is disposed so as to be recessed from the end surface of the insoluble portion 3a by the distance W5, electric field can be prevented from being concentrated, and an electroformed object can grow at a constant thickness. When the end portion of the electrode 5a protrudes from the end surface of the insoluble portion 3a, the electrode 5a may be flexed by stress, or a "hollow" may be generated at the lower portion of the protruding electrode 5a at the time of electroforming. In contrast, since the end portion of the electrode 5a is disposed so as to be recessed from the end surface of the insoluble portion 3a by the distance W5, generation of the "hollow" can be suppressed.

The electrode 5a may be formed on the insoluble portion 3a and have an exposed surface. A position where the electrode 5a is to be formed is not limited. For this reason, one end of the electrode 5a may be disposed on the same plane as the end surface of the insoluble portion 3a or may protrude from the end surface of the insoluble portion 3a. The other end of the electrode 5a may be in contact with the insoluble portion 6a.

A specific description will now be provided for the electroforming mold 103 of this embodiment. For example, a description will be provided for an electroforming mold when a gear 130 shown in FIGS. 9 to 12 is manufactured as an electroformed component.

Figure 9:
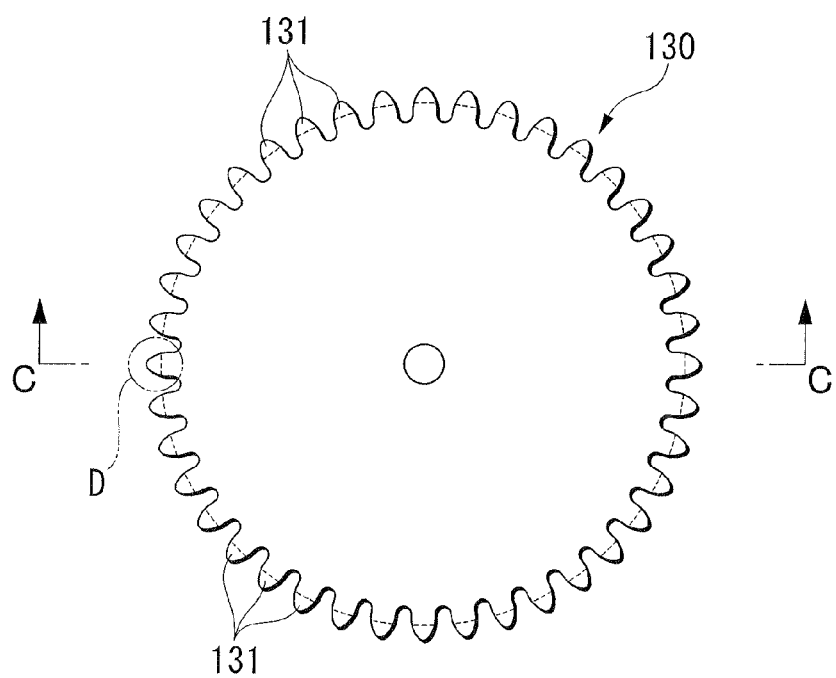
FIG. 9 is a diagram showing a gear (electroformed component) manufactured by using an electroforming mold shown in FIGS. 7A to 7G.
Figure 10:
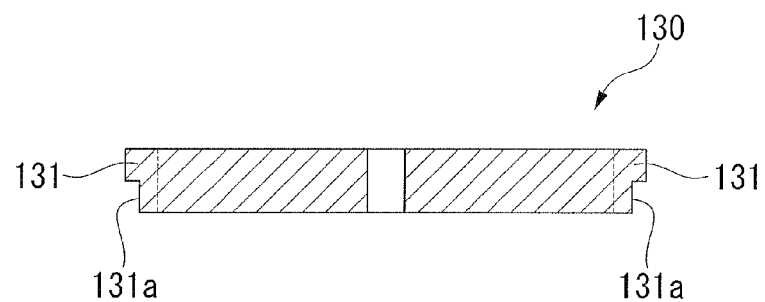
FIG. 10 is a sectional view taken along the line C-C of FIG. 9.
Figure 11:
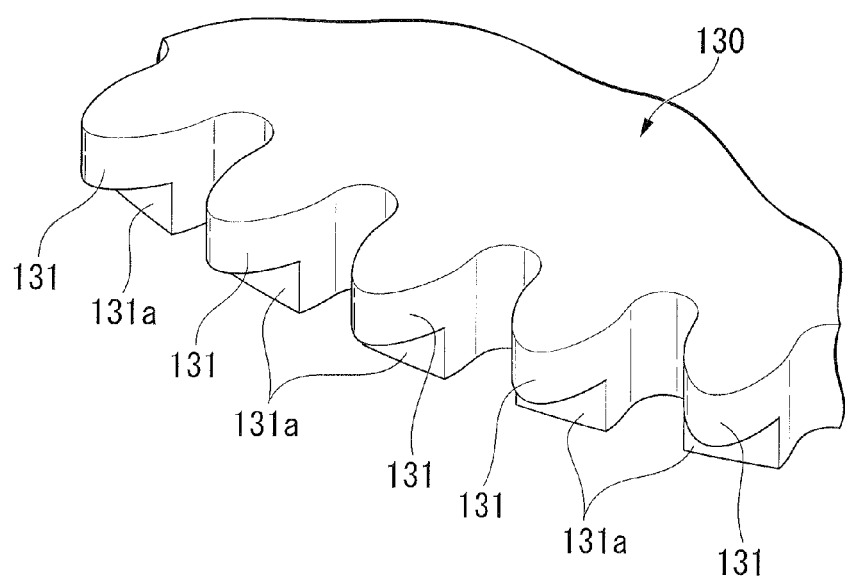
FIG. 11 is an enlarged perspective view of a cog portion of a gear shown in FIG. 9.
Figure 12:
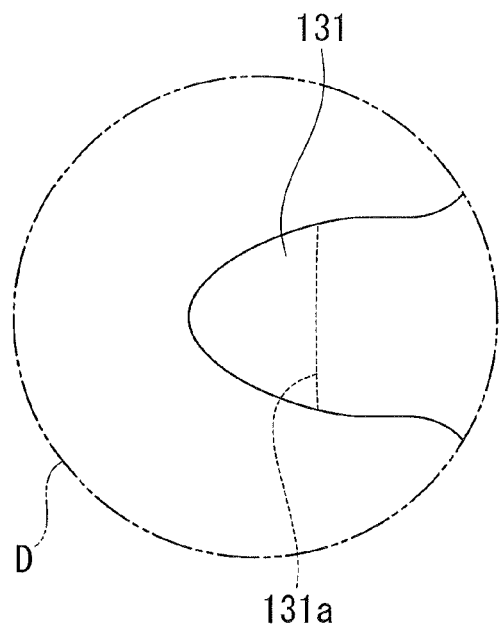
FIG. 12 is an enlarged view of a portion D in FIG. 9.

FIG. 9 is a front view of a gear. FIG. 10 is a sectional view taken along the line C-C of FIG. 9. FIG. 11 is an enlarged perspective view of essential parts of a gear. FIG. 12 is an enlarged front view of a cog.

In this case, the electroforming mold 103 is formed so as to have a circular exterior shape to surround the circumference of the gear 130. The second through hole 25 formed in the second photoresist layer 6 forms the exterior shape of the gear 130 in top view. The first through hole 24 formed in the first photoresist layer 3 has such a shape that it can give a step 131a on the front end side of a plurality of cog portion 131.

With this configuration, as shown in FIGS. 11 and 12, the gear 130, in which the front end of each cog portion 131 has a two-stage shape with saved weight, can be manufactured by electroforming. As a result, when the gear 130 is rotated, inertia moment at rotation can be reduced as far as possible.

Figure 13:
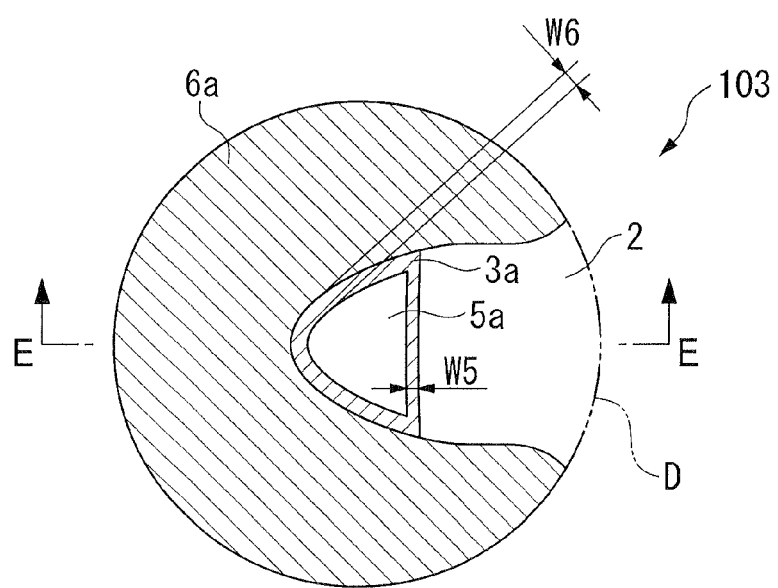
FIG. 13 is a top view of an electroforming mold corresponding to a portion D in FIG. 9.
Figure 14:
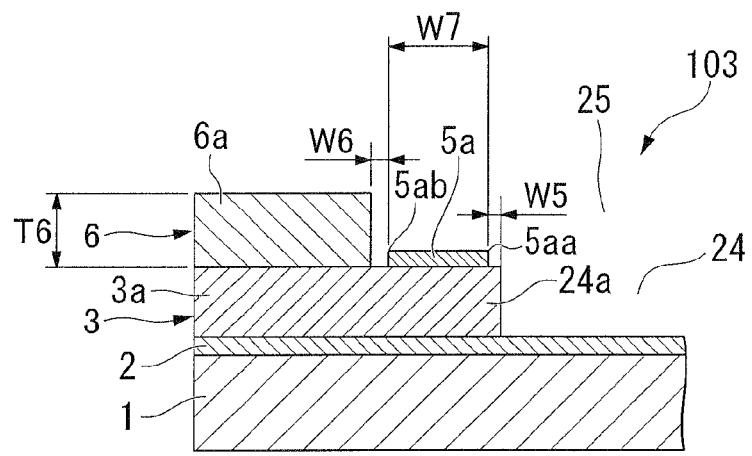
FIG. 14 is a sectional view taken along the line E-E of FIG. 13.

FIGS. 13 and 14 show the electroforming mold 103 when such a gear 130 is manufactured. FIG. 13 is a front view of an electroforming mold. FIG. 14 is a sectional view taken along the line E-E of FIG. 13. In order to efficiently electroform the respective cog portions 131 shown in FIG. 12, as shown in FIG. 13 and FIG. 14, the electrode 5a by dividing and patterning the conductive film 5 is formed on the first photoresist layer 3 for generating the step of each of the cog portions 131. In this case, the electrode 5a is formed so as to be separated from the second photoresist layer 6 by a predetermined distance W6 (for example, 1 μm to 25 μm), and not to be in contact with the second photoresist layer 6. The electrode 5a is also formed so as to be separated from the aperture end 24a of the first through hole 24 by a predetermined distance W5.

That is, when the electroforming mold 103 is viewed in top view, as shown in FIG. 13, there is such a state that the electrode 5a is patterned so as to become one size smaller two-dimensionally than the exposed pattern of the first photoresist layer 3. With this configuration, when the gear 130 is manufactured by electroforming, a line-shaped "streak" can be prevented from being formed on the outer surface of the gear 130. This will be described below in detail.

First, as shown in FIGS. 7E and 7F, in the manufacturing method according to the invention, a process sequence is adopted in which, after the electrode 5a is patterned on the first photoresist layer 3, the second photoresist layer 6 is further formed on the first photoresist layer 3 and the electrode 5a, and the second photoresist layer 6 is exposed through the second mask pattern 4c.

Figure 15:
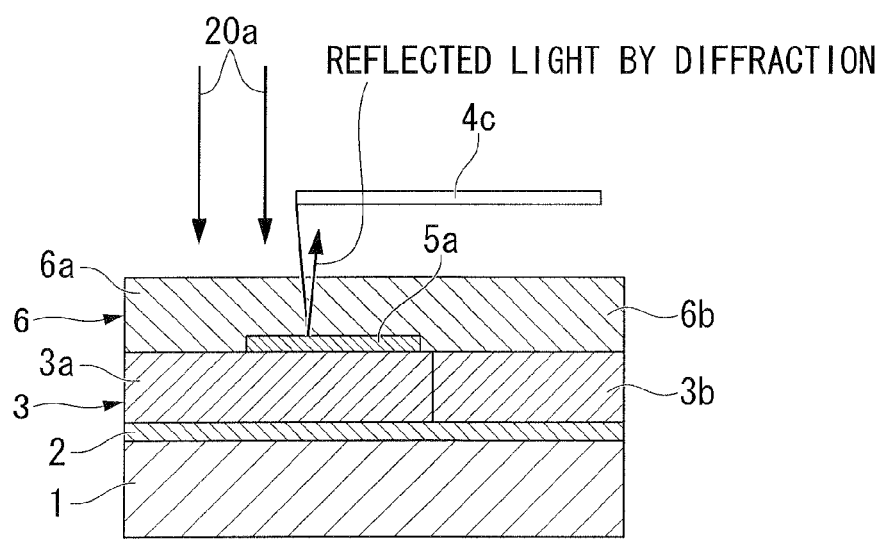
FIG. 15 is a process view when a gear is manufactured by using an electroforming mold in which an electrode is in contact with a photoresist.
Figure 16:
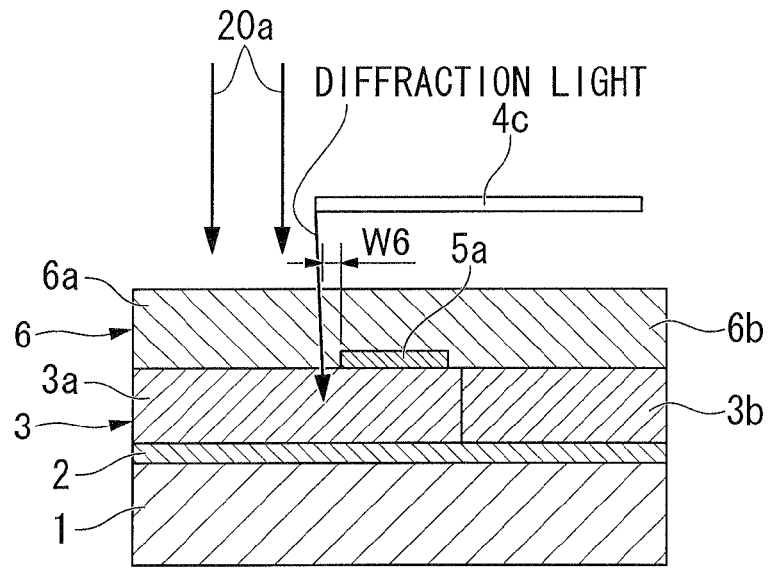
FIG. 16 is a process view when a gear is manufactured by using an electroforming mold shown in FIG. 14, in which an electrode is separated from the photoresist.

FIGS. 15 and 16 are sectional views showing a process of a method of manufacturing an electroforming mold. Particularly, as shown in FIG. 15, if the patterned electrode 5a is formed on the first photoresist layer 3 so as to be in contact with the second photoresist layer 6 (in FIG. 15, although a case in which the electrode 5a is formed so as to hide under the lower side of the second photoresist layer 6 is shown, the same is applied to a case in which the electrode 5a is in simple contact with the second photoresist layer 6), when the second photoresist layer 6 is exposed through the second mask pattern 4c, there is a phenomenon that ultraviolet light 20a may be reflected from the electrode 5a.

That is, there are problems in that irradiated ultraviolet light 20a exposes only the region of the second photoresist layer 6 that is not hidden by the second mask pattern 4c to form the insoluble portion 6a, and a part of ultraviolet light 20a having transmitted the second photoresist layer 6 is reflected from the electrode 5a and exposes a part of a region hidden by the second mask pattern 4c (a region for forming the soluble portion 6b). Particularly, ultraviolet light 20a passing nearby the end portion of the second mask pattern 4c is diffracted by the end portion and undergoes a change in the incident angle. For this reason, after being reflected from the electrode 5a, the ultraviolet light 20a is likely to expose the region that is region hidden by the second mask pattern 4c.

Consequently, it was intended, by the second mask pattern 4c, to reliably form the insoluble portion 6a and the soluble portion 6b at desired positions while clearly dividing the regions of the second photoresist layer 6 onto which ultraviolet light 20a is irradiated or not, but the insoluble portion 6a was also formed in an unintended region.

As a result, when the second photoresist layer 6 is developed to remove the soluble portion 6b, for example, a line-shaped convex portion had been formed unnecessarily in the end surface of the insoluble portion 6a.

For this reason, when a metal is deposited by electroforming, a portion that is in contact with the convex portion was concaved. As a result, as described above, a gear (electroformed component) 130 with a line-shaped "streak" on the outer surface thereof was manufactured.

In contrast, as shown in FIG. 16, if the electrode 5a is formed so as to be separated from the second photoresist layer 6 by a predetermined distance W6 and not to be in contact with the second photoresist layer 6, when the second photoresist layer 6 is exposed, ultraviolet light 20a diffracted at the end portion of the second mask pattern 4c passes through the gap between the electrode 5a and the second photoresist layer 6. Thus, light is not reflected from the electrode 5a. That is, generation of reflected light due to the electrode 5a can be suppressed. Therefore, the soluble portion 6b and the insoluble portion 6a can be formed in the second photoresist layer 6 in accordance with the regions divided by the second mask pattern 4c, and thus generation of an unnecessary insoluble portion 6a, such as a line-shaped convex portion, can be eliminated.

As a result, a gear 130, which has a smoothed outer surface without a "streak" or the like, can be reliably manufactured by electroforming Particularly, the gear 130 is put in a state that the outer surface thereof is ground each time it is repeatedly engaged with another gear through the cog portions 131. However, since the smoothed outer surface without a "streak" can be formed, slide resistance can be reduced as far as possible. Therefore, the gear 130 can be rotated more smoothly, and endurance can be improved.

The electrode 5a is formed so as to be separated from the aperture end 24a of the first through hole 24 by a predetermined distance W5. For this reason, when a metal is deposited near the aperture end 24a, the metal does not come into contact with the electrode 5a without any delay. Therefore, an electric field can be prevented from being concentrated, and the metal can be prevented from being deposited in a distorted shape. As a result, a metal can be reliably and easily deposited at a uniform thickness, and electroforming can be executed in accordance with the electroforming mold 103.

Next, a metal deposition behavior when an electroformed component is manufactured by using the electroforming mold shown in FIG. 14 will be examined. Let the thickness of the second photoresist layer 6 be T6, and the width of the electrode 5a between the inner edge 5aa of the electrode 5a toward the aperture end of the first through hole 24 of the first photoresist layer 3 and the outer edge 5ab of the electrode 5a opposite a side surface at which the second through hole 25 of the second photoresist layer 6 is formed be W7.

Figure 17:
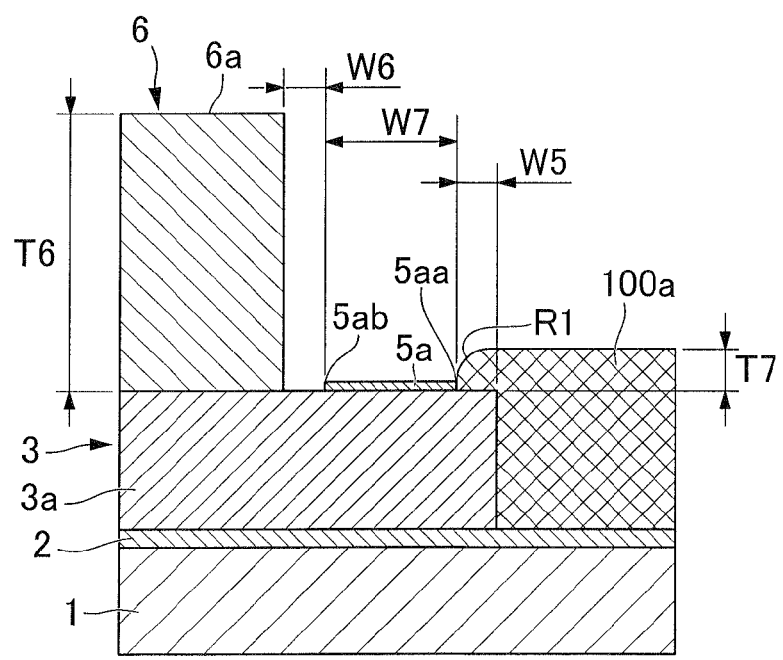
FIG. 17 is a sectional view showing a deposition state of a metal in an electroforming mold.

FIGS. 17 to 20 are diagrams showing metal deposition situations inside the electroforming mold moment by moment. The electroformed object (metal) 100a is deposited from the upper surface of the bottom conductive film 2 in the thickness direction (upward). As shown in FIG. 17, if the electroformed object 100a is deposited to the thickness beyond that of the first photoresist layer 3, the electroformed object grows in a lateral direction, as well as the thickness direction. The growing rate in the thickness direction is substantially the same as the growing rate in the lateral direction. Therefore, when the electroformed object 100a reaches the inner edge 5aa of the electrode, the electroformed object 100a develops beyond the first photoresist layer 3 by a step T7. The increased step T7 is substantially the same as the recess distance W5 of the electrode 5a from the end surface of the insoluble portion 3a. Consequently, a circular step portion R1 is formed in an outer circumference of an upper end of the electroformed object 100a.

Figure 18:
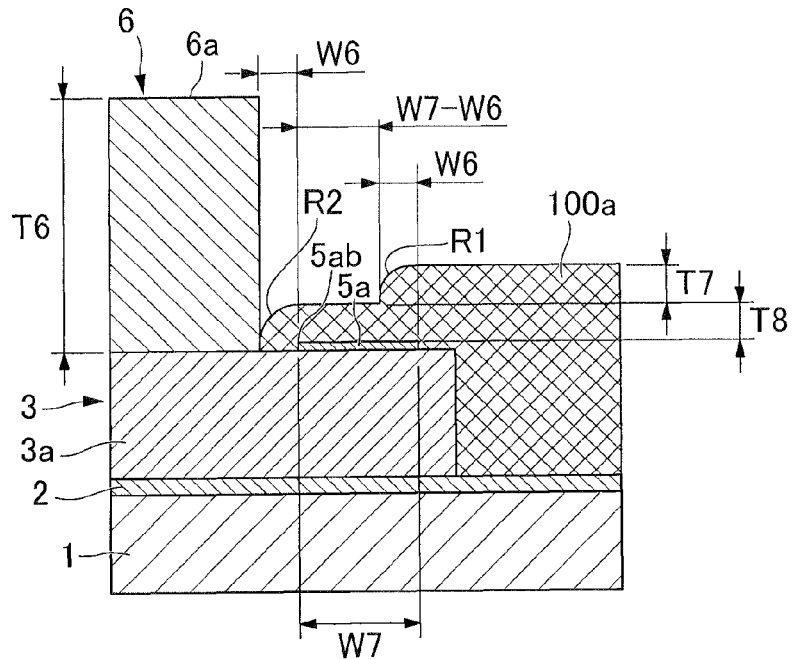
FIG. 18 is a sectional view showing a deposition state of a metal in the electroforming mold.

Thereafter, current starts to flow to the electrode 5a, and thus the electroformed object 100a is also deposited directly on the electrode 5a. Next, as shown in FIG. 18, if the electroformed object 100a reaches the side surface of the insoluble portion 6a of the second photoresist layer, the electroformed object 100a is deposited on the electrode 5a by a step T8. The step T8 is substantially the same as the distance W6 by which the electrode 5a is separated from the insoluble portion 6a. In this case, the step R1 grows in the lateral direction, and thus it is out of alignment outwardly by a value corresponding to the distance W6.

Figure 19:
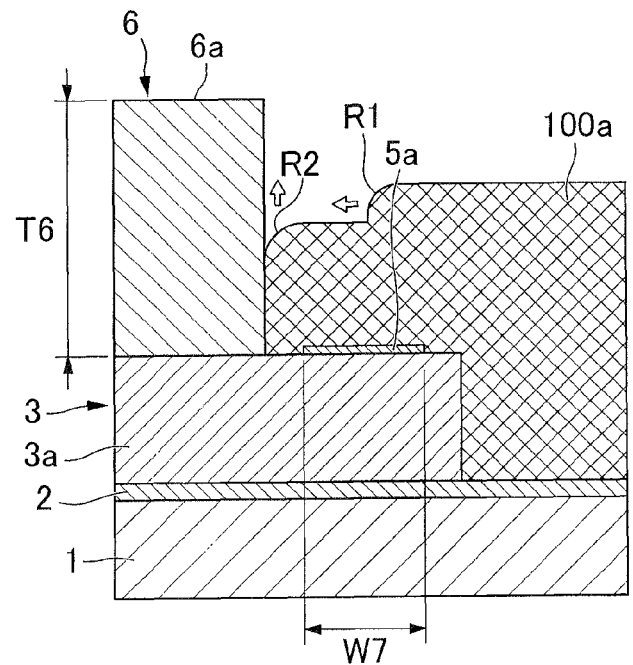
FIG. 19 is a sectional view showing a deposition state of a metal in the electroforming mold.

Thereafter, the electroformed object 100a is sequentially deposited in the thickness direction. In this case, as shown in FIG. 19, as the electroformed object 100a is deposited, the step R1 develops outwardly. Meanwhile, a circular step portion R2 that is formed near the side surface of the insoluble portion 6a of the second photoresist layer does not grow in the lateral direction and simply moves in the thickness direction since the circulation of the electroforming liquid around the step portion R2 is not uniform.

Figure 20:
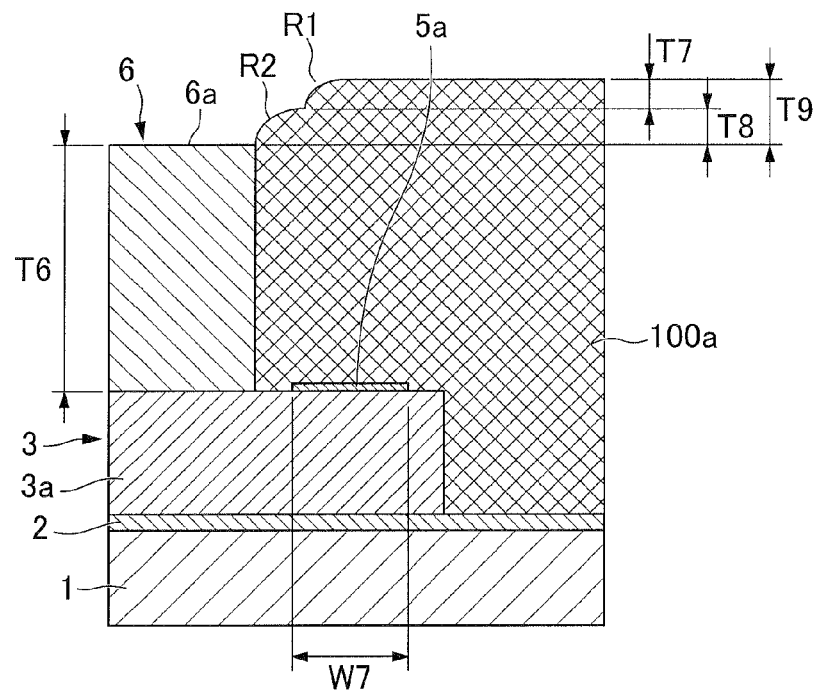
FIG. 20 is a sectional view showing a deposition state of a metal in the electroforming mold.

Next, as shown in FIG. 20, if the electroformed object 100a is deposited to a predetermined thickness, voltage application stops, and electroforming ends. In this case, both the step portions R1 and R2 are not connected to each other, and since the step portions R1 and R2 are present, a step T9 (T7+T8) remains in the electroformed object. As occasion demands, in order to eliminate the step T9, grinding or cutting is executed, and the thickness of the electroformed object 100a is uniformed.

Figure 21:
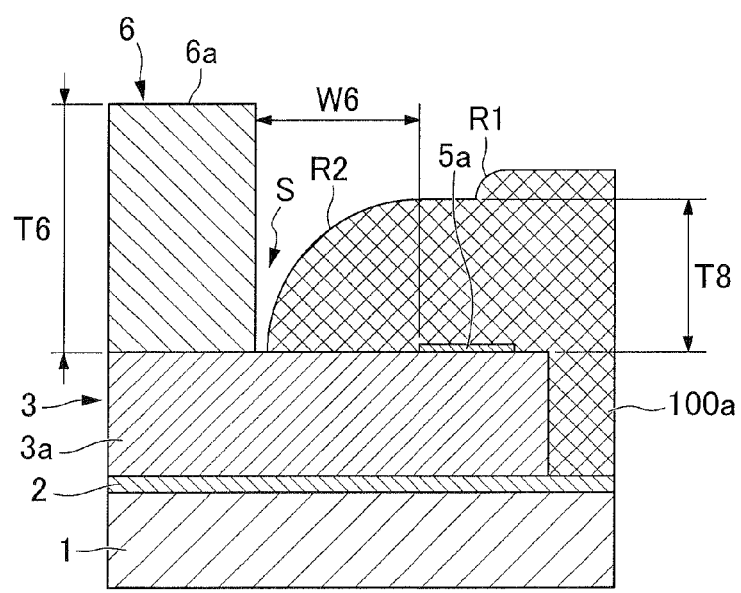
FIG. 21 is a sectional view showing another example of a deposition state of a metal in the electroforming mold.

FIG. 21 is a diagram showing a metal deposition behavior when the distance W6 is too large. FIG. 21 shows a state before an electroformed object comes into contact with the second photoresist layer. The size of the circular step portion R2 that is formed near the side surface of the insoluble portion 6a of the second photoresist layer depends on the distance W6 by which the electrode 5a is separated from the insoluble portion 6a. If the distance W6 is too long, the radius of the step portion R2 is more than a predetermined value. In this case, the aspect ratio of a lower portion of a space S defined by the side surface of the insoluble portion 6a and an outer surface of the step portion R2 increases. For this reason, circulation of the electroforming liquid deteriorates in the lower portion of the space S. Accordingly, a metal ion concentration is lowered, and the electroformed object is hard to grow in the lateral direction. In addition, air bubbles are likely to be accumulated, a "hollow" is generated in the electroformed object 100a, and the structure of a metal to be deposited changes. In order to suppress occurrence of these problems, the distance W6 by which the electrode 5a is separated from the insoluble portion 6a is preferably set to be equal to or less than 25 μm.

The distance W6 by which the electrode 5a is separated from the insoluble portion 6a may be set to a smaller value. To this end, when the electrode 5a is formed, the patterning resist 10 needs to be positioned with high accuracy, which inevitably causes an increase in costs. For this reason, the distance W6 by which the electrode 5a is separated from the insoluble portion 6a, is preferably set to be equal to or more than 1 μm.

That is, the distance W6 by which the electrode 5a is separated from the insoluble portion 6a is preferably set to be in a range of 1 μm to 25 μm. More preferably, the range is from 2 μm to 15 μm. Therefore, occurrence of a problem, such as generation of a "hollow" in the electroformed object 100a or a change in the structure of a metal to be deposited, can be suppressed, and an increase in costs can be suppressed.

As described above, if the electroformed object 100a is deposited, the step T9, which is the sum of the step T7 and the step T8, remains in the upper portion of the electroformed object.

The step T7 is substantially the same of the recess distance W5 of the electrode 5a from the end surface of the insoluble portion 3a, and the step T8 is substantially the same as the distance W6 by which the electrode 5a is separated from the insoluble portion 6a. That is, at the time of completion, the step T9 of the electroformed object substantially becomes the sum of the recess distance W5 and the distance W6.

The recess distance W5 of the electrode 5a from the end surface of the insoluble portion 3a depends on accuracy when the patterning resists 10a and 10b are manufactured, but since the patterning resists 10a and 10b are formed directly on the upper side of the intermediate conductive film 5, they can be manufactured with a high level of accuracy. For this reason, the recess distance W5 can be substantially close to an intended shape, and it does not become problematic. The distance W6 by which the electrode 5a is separated from the insoluble portion 6a depends on the accuracy of the position of the second mask pattern 4c. The second mask pattern is disposed so as to be separated above the second photoresist layer 6. In addition, the second photoresist layer 6 is interposed between the second mask pattern 4c and the electrode 5a. In this light, the position accuracy of the second mask pattern with respect to the electrode 5a cannot but be lowered.

For this reason, the problematic distance W6, by which the electrode 5a is separated from the insoluble portion 6a, has been examined while changing the ratio with respect to the thickness T6 of the second photoresist layer 6, and consequently, it has been seen that if the ratio of the thickness T6 of the second photoresist layer with respect to the distance W6 is set to be in a range of 2 to 5, a variation in the thickness of the electroformed object 100a becomes approximately two times larger than the distance W6.

It has been also seen that if the ratio of the thickness T6 of the second photoresist layer with respect to the distance W6 is set to be in a range of 5 to 10, a variation in the thickness of the electroformed object 100a becomes smaller than that described above, and the amount of additional grinding or cutting is reduced.

It has been also seen that if the ratio of the thickness T6 of the second photoresist layer with respect to the distance W6 is set to be equal to or more than 10, a variation in the thickness of the electroformed object 100a further becomes smaller than that described above, the surface of the electroformed object 100a can be substantially made flat, and additional grinding or cutting can be omitted.

This is because, on an assumption that the thickness T6 of the second photoresist layer is fixed, an increase in the ratio of the thickness T6 of the second photoresist layer with respect to the distance W6 means that the distance W6 decreases, and consequently, at the time of completion, the step T9 of the electroformed object, which is the sum of the recess distance W5 and the distance W6, can become small.

As shown in FIG. 18, when the electroformed object 100a reaches the side surface of the insoluble portion 6a, the difference between an outward front end of the step portion R1 and the outer edge 5ab of the electrode 5a is represented by W7-W6. Thereafter, in order to completely deposit the metal into the electroforming mold, it is necessary to grow the electroformed object 100a by the thickness T6 of the second photoresist layer. In this case, the step portion R1 develops outwardly by T6.

Therefore, while the electroformed object is growing, in order for the step portions R1 and R2 to not be connected to each other, the following condition needs to be satisfied.

$$W7-W6>T6$$

That is, while the electroformed object 100a is growing, the step portions R1 and R2 are not connected to each other insofar as the condition represented by the above formula is satisfied. As a result, an electroformed object can be manufactured while preventing quality from being deteriorated.

If the step portions R1 and R2 are connected to each other while the electroformed object is growing, an aspect ratio of a space between the corresponding portion and the side surface of the insoluble portion increases. For this reason, as described above, circulation of the electroforming liquid deteriorates and air bubbles are likely to be accumulated. As a result, there may be a problem in that a "hollow" is generated in the electroformed object 100a, or the structure of a metal to be deposited changes.

The predetermined distance W6 between the electrode 5a and the second photoresist layer 6 may be set on the basis of the thickness of the second photoresist layer 6. For example, when the thickness of the second photoresist layer 6 increases, ultraviolet light 20a diffracted at the second mask pattern 4c is deflected toward the soluble portion 6b until it passes through the second photoresist layer 6. For this reason, the predetermined distance W6 is preferably set to be larger, to thereby widen the spacing between the electrode 5a and the second photoresist layer 6. Therefore, generation of reflected light, which is reflected from the electrode 5a, can be reliably suppressed.

Fourth Embodiment

FIGS. 22A to 22D are diagrams illustrating an electroforming mold 1001 according to a fourth embodiment of the invention and a method of manufacturing electroformed components 120 and 121 using the electroforming mold 1001. In the fourth embodiment, the same parts as the constituent elements in the first embodiment are represented by the same reference numerals, and descriptions thereof are omitted.

Figure 22A:
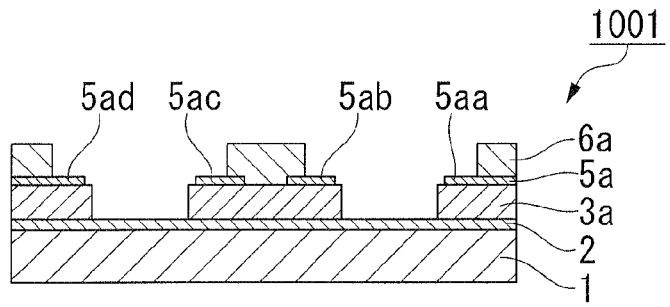
FIGS. 22A to 22D are diagrams showing a process for manufacturing an electroformed component according to a fourth embodiment of the invention.

FIG. 22A is a sectional view showing the electroforming mold 1001 that is an example in which a plurality of electroforming molds according to the invention are provided in parallel. As shown in FIG. 22A, the mold is formed so as to have a plurality of concave portions on the substrate 1. Electrodes 5aa, 5ab, 5ac, and 5ad do not straddle the respective concave portions and are formed independently from each other.

Figure 22B:
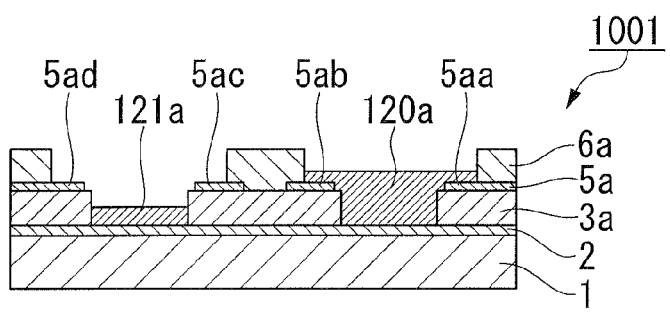
Figure 22C:
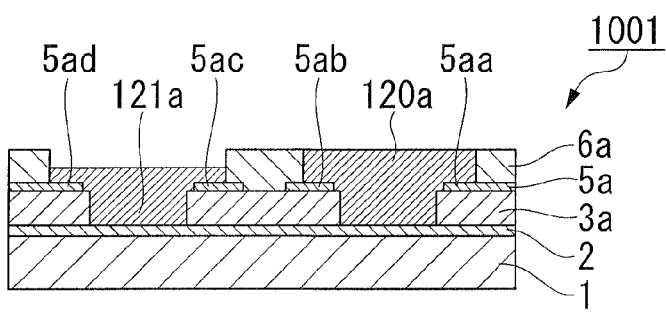

FIG. 22B is a sectional view showing an initial process when electroformed objects are deposited by using a plurality of electroforming molds provided in parallel. FIG. 22C is a sectional view showing a later process when electroformed objects are deposited by using the same electroforming molds. As shown in FIG. 22B, the electroformed objects (deposited metal) 120a and 121a are deposited from the exposed upper surface of the bottom conductive film 2 by using an electroforming method. The electroformed objects 120a and 121a that are deposited by using the electroforming method do not necessarily have a uniform deposition rate at the respective concave portions. For this reason, as shown in FIG. 22B, when the electroformed object 120a and the electroformed object 121a are compared with each other, the deposition rate of the electroformed object 120a may be larger than the deposition rate of the electroformed object 121a. In this case, since the electroformed object 120a is in contact with the electrodes 5aa and 5ab, current flows between the electrodes 5aa and 5ab. Therefore, the electroformed object 120a is deposited from the electrodes 5aa and 5ab. Meanwhile, since the electroformed object 121a is not in contact with the electrodes 5ac and 5ad, no current flows between the electrodes 5ac and 5ad. Therefore, the electroformed object 121a is not deposited on the electrodes 5ac and 5ad.

In FIG. 22C, if electroforming progresses and the electroformed object 121a is in contact with the electrodes 5ac and 5ad, current flows between the electrodes 5ac and 5ad. Therefore, the electroformed object 121a starts to be deposited from the electrodes 5ac and 5ad.

As described above, since the electrodes 5ab and 5ac separated from each other, each of the electrodes works only on the electroformed object 120a or 121a deposited from the respective concave portions. Therefore, even though the deposition rate of the electroformed objects 120a and 121a at the respective concave portions is not uniform, the electroformed objects 120a and 121a are deposited independently, and it is free of influence from the electroformed object 120a or 121a deposited in the neighboring mold.

Figure 22D:
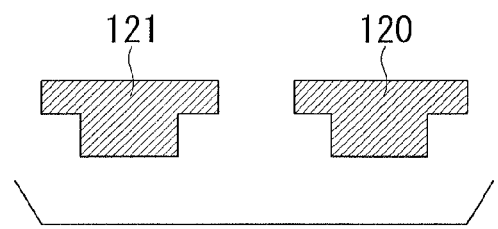

FIG. 22D is a sectional view of electroformed components obtained by deposition from the above-described electroforming mold. As shown in FIG. 22D, the electroformed objects 120a and 121a are taken out from the electroforming mold 1001 to obtain the electroformed components 120 and 121.

When it is intended to make the electroformed object 120a and the electroformed object 121a have the same desired thickness, for example, the thicknesses of the electroformed objects 120a and 121a are uniformed by a grinding process. In an electroforming process, when thickness control of the electroformed objects 120a and 121a is possible, a grinding process may not be executed.

For comparison with the electroforming mold 1001 shown in FIGS. 22A to 22D, deposition of the electroformed objects 120a and 121a when the electrodes 5ab and 5ac are not separated from each other, and the electrodes of the neighboring molds are connected to each other will be described with reference to FIGS. 23A to 23C.

Figure 23A:
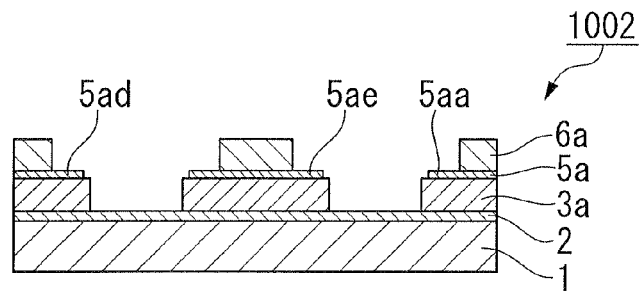
FIGS. 23A to 23C are diagrams showing a comparative example with respect to the fourth embodiment.

FIG. 23A is a sectional view showing a state when electroformed objects are deposited by using a plurality of electroforming molds provided in parallel. FIG. 23B is a sectional view showing an initial process when electroformed objects are deposited by using the same electroforming molds. FIG. 23C is a sectional view showing a later process when electroformed objects are deposited by using the same electroforming molds.

That is, as shown in FIG. 23A, an electroforming mold 1002 is formed by integrating an electrode of a right side mold and an electrode of a left side mold as an electrode 5ae.

Figure 23B:
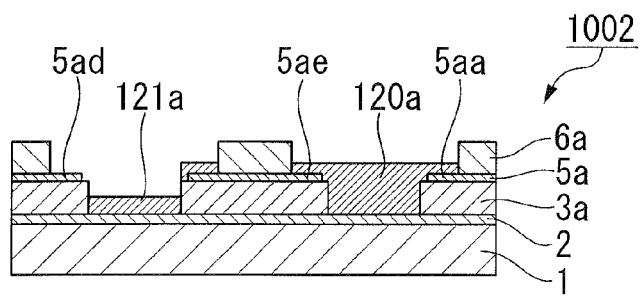

First, as shown in FIG. 23B, the electroformed objects 120a and 121a are deposited from the exposed upper surface of the bottom conductive film 2 by using an electroforming method. When the deposition rates of the electroformed objects 120a and the 121a to be deposited are not uniform, and the deposition rate of the electroformed object 120a is larger than the deposition rate of the electroformed object 121a, since the electroformed object 120a is in contact with the electrodes 5aa and 5ae, current flows between the electrodes 5aa and 5ae. Therefore, the electroformed object is deposited from the left end of the electrode 5ae, as well as the right end of the electrode 5ae. Meanwhile, since the electroformed object 121a is not in contact with the electrode 5ad yet, no current flows to the electrode 5ad. Therefore, in the left side mold, the electroformed object 121a is deposited from the bottom conductive film 2 and the electrode 5ae to make the deposition uneven.

Figure 23C:
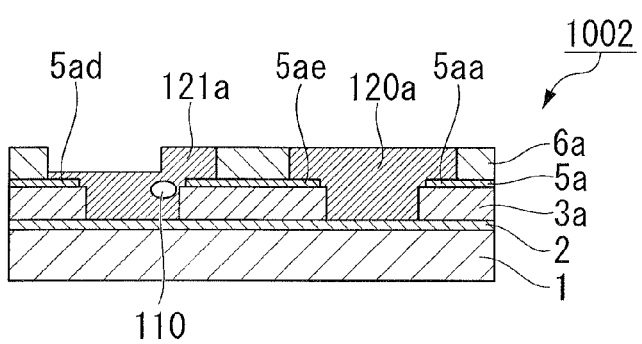

As shown in FIG. 23C, the electroformed objects 121a deposited from the bottom conductive film 2 and the electrode 5ae further grow to be in contact with each other on the way, a "hollow" 110 may be formed in the electroformed object 121a.

Accordingly, when a plurality of electroforming molds are provided on the same substrate, like the electroforming mold 1001 of the fourth embodiment, if the electrodes of the neighboring electroforming molds are separated from each other, the uniformly deposited electroformed components 120 and 121 can be obtained.

Figure 24A:
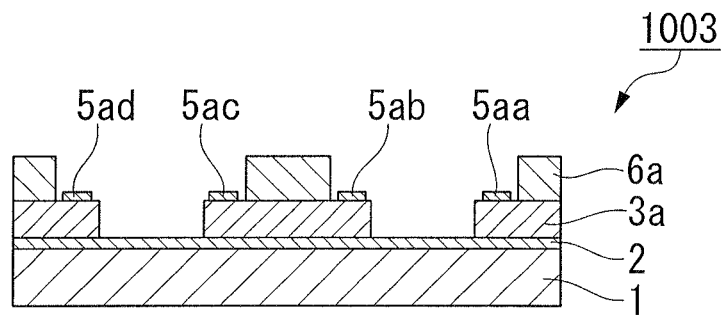
FIGS. 24A to 24C are diagrams showing a modification of the fourth embodiment.
Figure 24B:
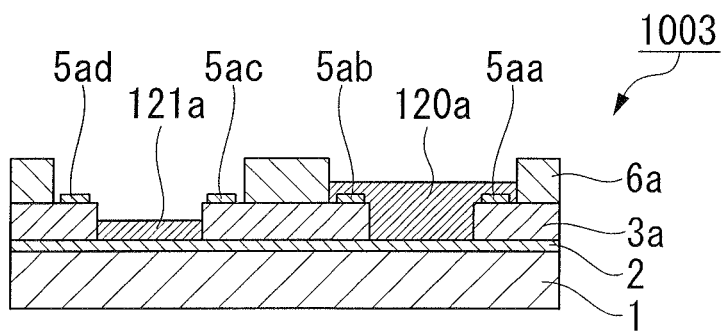
Figure 24C:
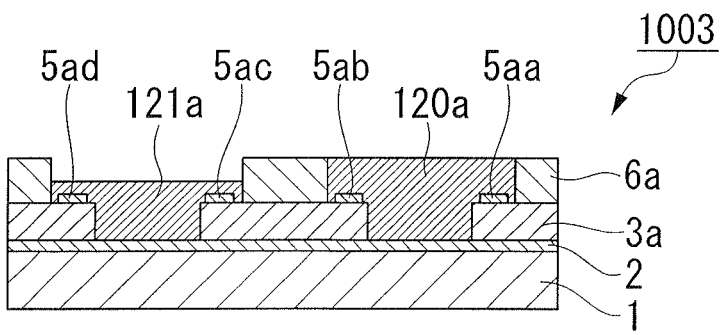

An electroforming mold 1003 shown in FIG. 24A is an example in which a plurality of electroforming molds according to the invention are provided in parallel. FIG. 24A is a sectional view showing a modification of the electroforming mold shown in FIGS. 22A to 22D and the method of manufacturing an electroformed component using the electroforming mold. Electrodes 5aa, 5ab, 5ac, and 5ad formed on the insoluble portion 3a are provided so as to be separated from the insoluble portion 6a. FIG. 24B is a sectional view showing an initial process when electroformed objects are deposited by using a plurality of electroforming molds provided in parallel. FIG. 24C is a sectional view showing a later process when electroformed objects are deposited by using the same electroforming molds.

According to the electroforming mold 1003, as shown in FIG. 24B, when the electroformed object 120a and the electroformed object 121a are compared with each other, even though the deposition amount of the electroformed object 120a is faster than the deposition amount of the electroformed object 121a, as shown in FIG. 24C, the neighboring molds can independently deposit the electroformed objects 120a and 121a. Therefore, similarly to a case in which the electroforming mold 1001 is used, the uniformly deposited electroformed components 120 and 121 can be obtained.

As a result, when the electrodes 5aa, 5ab, 5ac, and 5ad are provided so as to be separated from the insoluble portion 6a, the same effects as the embodiment described with reference to FIGS. 22A to 22D can be obtained.

Fifth Embodiment

Next, a fifth embodiment of a method of manufacturing an electroforming mold according to the invention will be described. In the fifth embodiment, for example, a case in which the electroforming mold used in the fourth embodiment is manufactured will be described.

In the fifth embodiment, the same parts as the constituent elements in the first embodiment are represented by the same reference numerals, and descriptions thereof will be omitted.

Figure 25A:
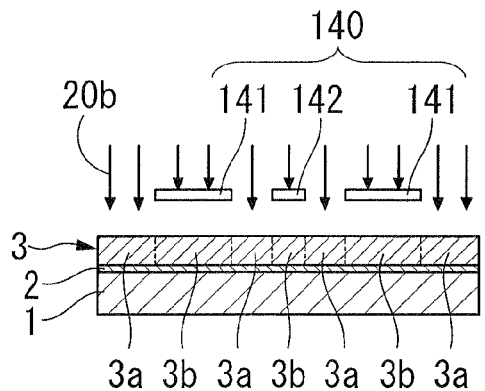
FIGS. 25A to 25H are diagrams showing a process for manufacturing an electroformed component according to a fifth embodiment of the invention.
Figure 25B:
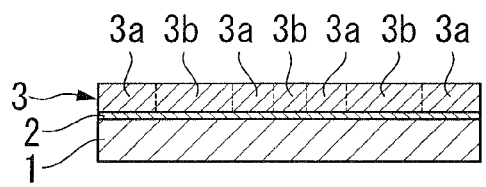

FIG. 25A is a sectional view showing a first photoresist layer formation step on a substrate and a first photoresist layer exposure step in the fifth embodiment. FIG. 25B is a sectional view showing a state where the first photoresist layer exposure step is completed. As shown in FIG. 25A, first, a bottom conductive film 2 and a first photoresist layer 3 are sequentially formed on an upper surface of a substrate 1, and a first mask pattern 140 having three mask pattern elements 141, 142, and 141 is disposed above the first photoresist layer 3. In this case, the two mask pattern elements 141 are disposed so as to be positioned above a first through hole 24, which is to be subsequently formed, and the mask pattern element 142 is disposed so as to be interposed between the two mask pattern elements 141.

After the first mask pattern 140 is disposed, as shown in FIG. 25A, ultraviolet 20b is irradiated from above through the first mask pattern 140. Accordingly, a region of the first photoresist layer 3 that is not hidden by the first mask pattern 140 is exposed by ultraviolet light 20b. As a result, the exposed region of the first photoresist layer 3 becomes an insoluble portion 3a, and the unexposed region hidden by the first mask pattern 140 becomes a soluble portion 3b.

Figure 25C:
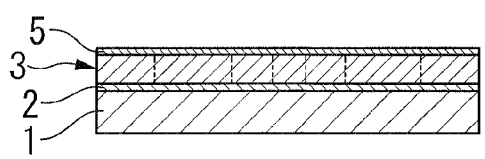

FIG. 25C is a sectional view showing an intermediate conductive film formation step in the fifth embodiment. After the step described with reference to FIG. 25B, while development is not executed, a conductive material is thermally deposited by using a vacuum deposition method within a temperature range in which light with a wavelength within a range not causing photoreaction in the first photoresist layer 3 is emitted. Thus, an intermediate conductive film 5 is formed on an upper surface of the first photoresist layer 3.

Figure 25D:
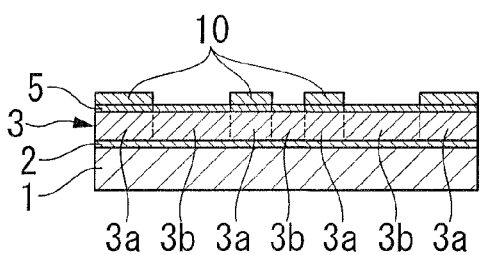

FIG. 25D is a sectional view showing a patterning resist formation step in the fifth embodiment. As shown in FIG. 25D, a patterning resist 10 is formed.

Figure 25E:
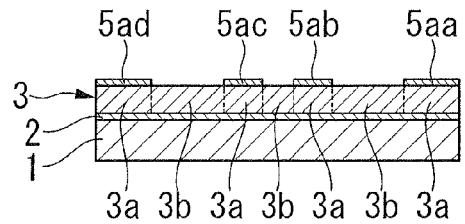

FIG. 25E is a sectional view showing a patterning step and a patterning resist removal step in the fifth embodiment. As shown in FIG. 25E, the intermediate conductive film 5 is patterned with the patterning resist 10 as an etching mask, to thereby obtain electrodes 5aa, 5ab, 5ac, and 5ad5a. With respect to the photoresist 3, the upper surfaces of the soluble portions 3b are exposed. Thereafter, the patterning resist 10 on the electrodes 5aa, 5ab, 5ac, and 5ad (intermediate conductive film 5) is removed. In removing the patterning resist 10, a separating liquid is used. As the separating liquid, an alkaline or acid aqueous solution is used. Preferably, an organic solvent is not used since it dissolves the soluble portions 3b.

Figure 25F:
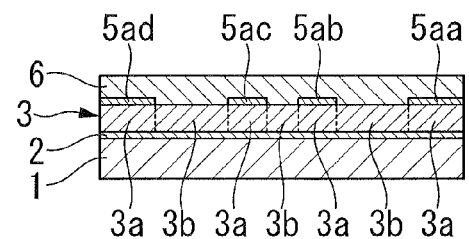

FIG. 25F is a sectional view showing a second photoresist layer formation step in the fifth embodiment. As shown in FIG. 25F, a second photoresist layer 6 is formed on the upper surfaces of the electrodes 5aa, 5ab, 5ac, and 5ad and the expose upper surfaces of the soluble portions 3b.

Figure 25G:
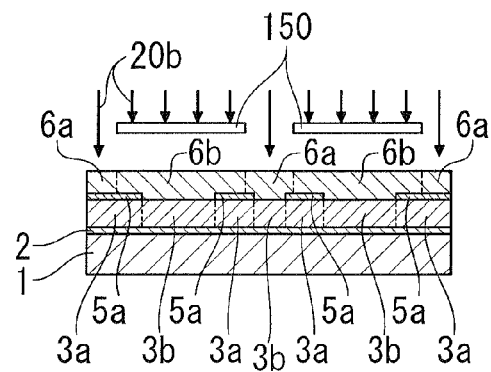

FIG. 25G is a sectional view showing a second photoresist layer exposure step in the fifth embodiment. As shown in 25G, a second mask pattern 150 is disposed above the second photoresist layer 6, and ultraviolet light 20b is irradiated from above toward the second photoresist layer 6 through the second mask pattern 150. In this case, two mask pattern elements constituting the second mask pattern are disposed so as to completely hide two soluble portions 3b having been hidden by the two mask pattern elements 141, and to partially hide the insoluble portions 3a.

The soluble portions 3b having been hidden by the mask pattern elements 141 are not hidden at the time of the second exposure.

By the irradiation of ultraviolet light 20b, the regions of the second photoresist layer 6 having not been hidden by the two mask pattern elements are exposed. Since the second photoresist layer 6 is formed of a negative type photoresist, the exposed regions become insoluble portions 6a, and the unexposed regions hidden by the second mask pattern 150 become soluble portions 6b.

Particularly, the portions that become the soluble portion 3b by the first exposure are exposed by second irradiation of ultraviolet light 20b. Accordingly, the soluble portions 3b are changed to the insoluble portions 3a.

Figure 25H:
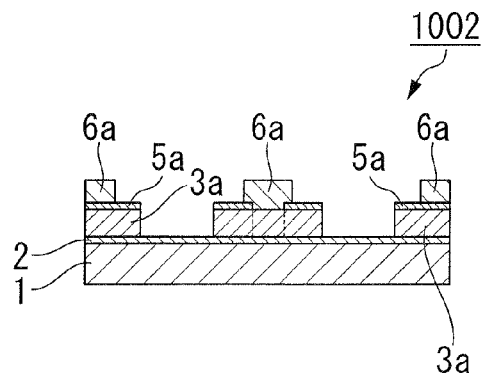

Finally, the first and second photoresist layers 3 and 6 are developed to remove the soluble portions 3b and 6b of both the photoresist layers 3 and 6. As a result, as shown in FIG. 25H, the electroforming mold (the electroforming mold in the fourth embodiment) 1001 in which a first through hole 24 and a second through hole 25 are formed on the substrate 1 so as to be close to each other can be manufactured. FIG. 25H is a sectional view of an electroforming mold manufactured in such a manner.

As described above, according to the method of manufacturing an electroforming mold of this embodiment, the first photoresist layer 3 is exposed by the first irradiation of ultraviolet light 20b. Therefore, even though an electroforming mold has a complex shape, it can be easily manufactured, the electrodes 5aa, 5ab, 5ac, and 5ad and the first through hole 24 can be formed at target positions with high accuracy.

In this embodiment, the thickness of the intermediate conductive film 5 is preferably thinned as far as possible. With this configuration, the intensity of reflected light at the electrodes 5aa, 5ab, 5ac, and 5ad, which has been described in the foregoing fifth embodiment, can be reduced. As a result, when an electroformed component is manufactured by using the electroforming mold 1001 of this embodiment, a "streak" can be prevented from being generated on the outer surface of the electroformed component.

The technical scope of the invention is not limited to the foregoing embodiments, and various changes may be made without departing from the spirit of the invention.

Figure 26:
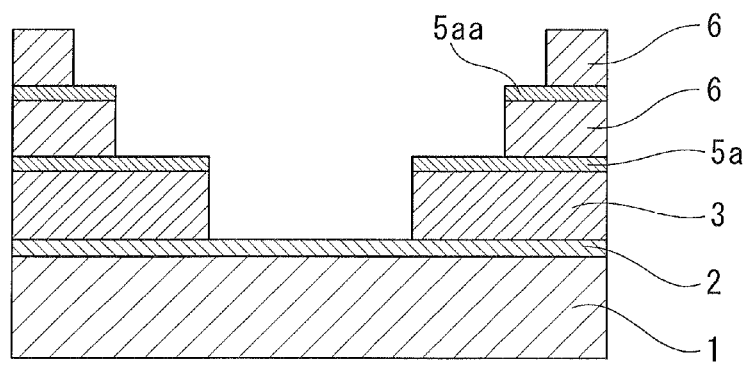
FIG. 26 is a diagram showing a modification of the invention, and a sectional view showing an electroforming mold in which a resist layer is provided in three stages.
Figure 27:
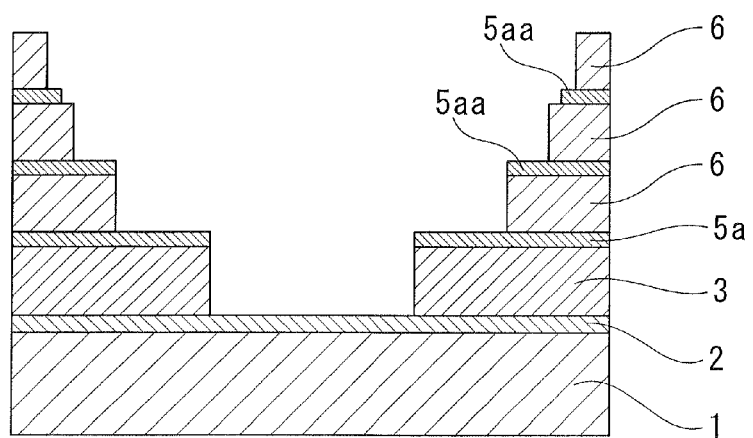
FIG. 27 is a diagram showing another modification of the invention, and a sectional view showing an electroforming mold in which a resist layer is provided in four stages.
Figure 28:
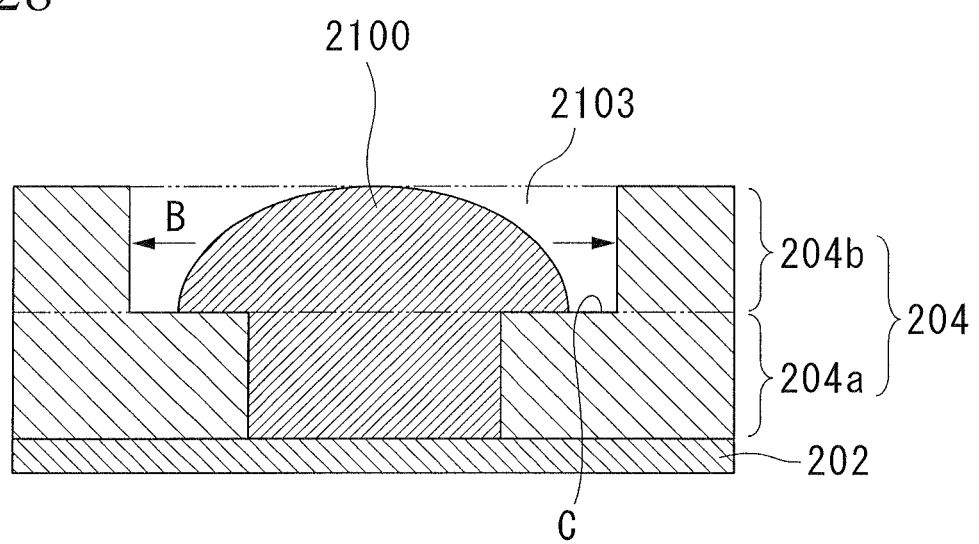
FIG. 28 is a sectional view illustrating the drawbacks inherent in the related art.

For example, in the foregoing first embodiment, after the first photoresist layer formation step, the first photoresist layer exposure step, the intermediate conductive film formation step, the patterning resist formation step, the patterning step, the patterning resist removal step, the second photoresist layer formation step, and the second photoresist layer exposure step are executed, the soluble portion removal step is executed to manufacture the two-stage electroforming mold 101 having the second photoresist layer 6 on the first photoresist layer 3, as shown in FIG. 1G but the invention is not limited thereto. For example, before the soluble portion removal step, a series of steps including the intermediate conductive film formation step, the patterning resist formation step, the patterning step, the patterning resist removal step, the second photoresist layer formation step, and the second photoresist layer exposure step may be further executed one time, and the soluble portion removal process may be executed, to thereby obtain a three-stage electroforming mold 201 having two second photoresist layers 6 with an electrode 5aa interposed therebetween, as shown in FIG. 26. When a series of steps described above are executed two times, as shown in FIG. 27, a four-stage electroforming mold 201 having three second photoresist layers 6 with electrodes 5aa and 5aa individually interposed therebetween can be obtained. FIG. 26 is a sectional view showing an electroforming mold in which resist layer is laminated in three stages. FIG. 27 is a sectional view showing an electroforming mold in which a resist layer is laminated in four stages.

Of course, the number of repetitions of a series of steps described above is not limited to two, and a series of steps may be executed three or more times.

All the embodiments having been described hitherto can also be practiced by replacing a negative type photoresist with a positive type photoresist with respect to the first photoresist layer 3. In this case, for the second photoresist layer 6, either a negative type photoresist or a positive type photoresist may be used.

When the positive type first photoresist layer 3 is exposed, the first mask pattern 4a is disposed above a region where the insoluble portion 3a is to be formed, and light is irradiated onto a region where the soluble portion 3b is to be formed. In exposing the second photoresist layer 6, when a negative type photoresist is selected, the second mask pattern 4c is disposed above a region where the soluble portion 6b is to be formed, and light is irradiated onto a region where the insoluble portion 6a is to be formed. When a positive type photoresist is selected, the second mask pattern 4c is disposed above a region where the insoluble portion 6a is to be formed, and light is irradiated onto a region where the soluble portion 6b is to be formed.

In the foregoing embodiments, when the conductive material is thermally deposited by using the vacuum deposition method to form the intermediate conductive film 5, an electrical resistance heating method is used as heating means, but the invention is not limited thereto. For example, a heating method by laser ablation, in which laser light with a wavelength equal to or more than 400 nm to be emitted from an infrared laser light source, such as YAG or carbon dioxide is used, may be used.

Industrial Applicability

The invention provides a method of manufacturing an electroforming mold including the steps of forming a first photoresist layer on an upper surface of a conductive substrate, exposing the first photoresist layer through a first mask pattern disposed above the first photoresist layer to divide the first photoresist layer into a soluble portion and an insoluble portion, thermally depositing a conductive material by using a vacuum deposition method within a temperature range, in which light with a wavelength within a range not causing photoreaction in the first photoresist layer is emitted, to thereby form an intermediate conductive film on an upper surface of the first photoresist layer, forming a patterning resist on an upper surface of the intermediate conductive film, patterning the intermediate conductive film through the patterning resist, removing the patterning resist remaining after the step of patterning the intermediate conductive film, forming a second photoresist layer on an exposed upper surface of the first photoresist layer by the step of patterning the intermediate conductive film and an exposed upper surface of the intermediate conductive film by the removing of the patterning resist, exposing the second photoresist layer through a second mask pattern disposed above the second photoresist layer to divide the second photoresist layer into a soluble portion and an insoluble portion, and developing the first photoresist layer and the second photoresist layer to remove the soluble portion of each of the first and second photoresist layers.

According to the invention, when a multistage electroformed component is manufactured, instead of forming a mold for forming a next layer on a layer of a component formed by removing resist forming a side wall of an electroforming mold each time a layer is formed, a photoresist layer is formed and exposed, and multiple layers are developed in an overlap manner while an intermediate conductive film is interposed between the photoresist layers of the individual stages. In this way, a multistage electroforming mold having an intermediate conductive film at the bottom of each step portion can be manufactured.

What is claimed is:

1. A method of manufacturing an electroforming mold, comprising:
    a first photoresist layer formation step of forming a first photoresist layer on an upper surface of a conductive substrate;
    a first photoresist layer exposure step of exposing the first photoresist layer to light through a first mask pattern disposed above the first photoresist layer to divide the first photoresist layer into a first soluble portion and a first insoluble portion;
    an intermediate conductive film formation step of thermally depositing a conductive material by using a vacuum deposition method within a temperature range in which light with a wavelength within a range not causing photoreaction in the first photoresist layer is emitted, to thereby form an intermediate conductive film on an upper surface of the first photoresist layer;
    a patterning resist formation step of forming a patterning resist on an upper surface of the intermediate conductive film;
    a patterning step of patterning the intermediate conductive film through the patterning resist;
    a patterning resist removal step of removing the patterning resist remaining after the patterning step;
    a second photoresist layer formation step of forming a second photoresist layer on an upper surface of the first photoresist layer exposed by the patterning step and on an upper surface of the intermediate conductive film exposed by the patterning resist removal step;
    a second photoresist layer exposure step of exposing the second photoresist layer to light through a second mask pattern disposed above the second photoresist layer to divide the second photoresist layer into a second soluble portion and a second insoluble portion; and
    a soluble portion removal step of removing the first soluble portion of the first photoresist layer and the second soluble portion of the second photoresist layer by developing the first photoresist layer and the second photoresist layer.

2. The method of manufacturing an electroforming mold according to claim 1, wherein, in the intermediate conductive film formation step, an electrical resistance heating method is used as a heating means.

3. The method of manufacturing an electroforming mold according to claim 1, wherein, in the intermediate conductive film formation step, light with a wavelength within a range not causing photoreaction in the first photoresist layer is light with wavelength ranging from 0.4 μm to 30 μm.

4. The method of manufacturing an electroforming mold according to claim 1, wherein, in the intermediate conductive film formation step, the temperature range of heating of the conductive material, in which light with a wavelength within a range not causing photoreaction in the first photoresist layer is emitted, is from 170° C. to 2000° C.

5. The method of manufacturing an electroforming mold according to claim 1, wherein the conductive substrate is configured such that a bottom conductive film is formed on an upper surface of a substrate.

6. The method of manufacturing an electroforming mold according to claim 1, wherein the first photoresist layer and the second photoresist layer are formed of a negative type photoresist.

7. The method of manufacturing an electroforming mold according to claim 6, wherein, in the patterning resist formation step, the patterning resist is formed so as to cover only the first insoluble portion of the first photoresist layer divided by exposure through the first mask pattern.

8. The method of manufacturing an electroforming mold according to claim 7, wherein, in the patterning resist formation step, the patterning resist is formed so as to be recessed from a boundary between the first insoluble portion and the first soluble portion of the first photoresist layer toward the first insoluble portion by a distance equal to or more than 1 μm and equal to or less than 500 μm.

9. The method of manufacturing an electroforming mold according to claim 7, wherein, in the second photoresist layer exposure step, a part of an upper portion of a surface of the second photoresist layer in contact with the intermediate conductive film is exposed to light.

10. The method of manufacturing an electroforming mold according to claim 1, wherein, in the patterning resist formation step, a dry film resist is used as the patterning resist.

11. The method of manufacturing an electroforming mold according to claim 6, wherein, in the patterning step, the intermediate conductive film remains only on a part of the first insoluble portion of the first photoresist layer divided by exposure through the first mask pattern, and in the second photoresist layer exposure step, the second mask pattern is disposed above the second photoresist layer so as to protrude outwardly from the intermediate conductive film.

12. The method of manufacturing an electroforming mold according to claim 1, wherein a thickness of the conductive substrate is equal to or more than 100 μm and equal to or less than 10 mm, and a thickness of each of the first photoresist layer and the second photoresist layer is equal to or more than 1 μm and equal to or less than 5 mm.

13. The method of manufacturing an electroforming mold according to claim 5, wherein a thickness of the substrate is equal to or more than 100 μm and equal to or less than 10 mm, a thickness of the bottom conductive film is equal to or more than 5 nm and equal to or less than 10 μm, and a thickness of each of the first photoresist layer and the second photoresist layer is equal to or more than 1 μm and equal to or less than 5 mm.

14. The method of manufacturing an electroforming mold according to claim 1, wherein, before the soluble portion removal step, a series of steps including the intermediate conductive film formation step, the patterning resist formation step, the patterning step, the patterning resist removal step, the second photoresist layer formation step, and the second photoresist layer exposure step are further performed one or more times.

15. An electroforming mold comprising:
a conductive substrate;
a first photoresist layer formed on an upper surface of the conductive substrate, the first photoresist layer having a first through hole in a thickness direction thereof;
an intermediate conductive film disposed on a part of an upper surface of the first photoresist layer and formed by etching a conductive film; and
a second photoresist layer formed on a part of an upper surface of the intermediate conductive film, and having a second through hole disposed above a surface included in the upper surface of the first photoresist layer, the surface including an aperture surface of the first through hole.

16. An electroforming mold comprising:
a conductive substrate;
a first photoresist layer formed on an upper surface of the conductive substrate, the first photoresist layer having a first through hole in a thickness direction thereof;
a second photoresist layer formed on a part of an upper surface of the first photoresist layer, and having a second through hole disposed above a surface included in the upper surface of the first photoresist layer, the surface including an aperture surface of the first through hole; and
an intermediate conductive film disposed on the upper surface of the first photoresist layer in the second through hole and formed by etching a conductive film.

17. The electroforming mold according to claim 16, wherein, when a distance between a side surface defining the second through hole of the second photoresist layer and an outer edge of the intermediate conductive film opposite the side surface is defined to be W6, the distance W6 is set in a range of 1 μm to 25 μm.

18. The electroforming mold according to claim 16, wherein, when the thickness of the second photoresist layer is defined to be T6, a ratio of the thickness T6 with respect to the distance W6 is set to a value more than 2.

19. The electroforming mold according to claim 16, wherein, when the thickness of the second photoresist layer is defined to be T6, a ratio of the thickness T6 with respect to the distance W6 is set to a value more than 5.

20. The electroforming mold according to claim 16, wherein, when the thickness of the second photoresist layer is defined to be T6, a ratio of the thickness T6 with respect to the distance W6 is set to a value of more than 10.

21. The electroforming mold according to claim 16, wherein an inner edge of the intermediate conductive film is formed so as to be recessed from an aperture end of the first through hole of the first photoresist layer, and when a width of the intermediate conductive film between the inner edge of the intermediate conductive film toward the aperture end of the first through hole of the first photoresist layer and an outer edge of the intermediate conductive film opposite a side surface, at which the second through hole of the second photoresist layer is formed, is defined to be W7, and the thickness of the second photoresist layer is defined to be T6, the distance W6, the width W7, and the thickness T6 are set so as to satisfy the following formula:

$$W7 - W6 > T6.$$

* * * * *